(12) United States Patent
Tada et al.

(10) Patent No.: US 8,809,846 B2
(45) Date of Patent: Aug. 19, 2014

(54) ORGANIC MOLECULAR MEMORIES AND ORGANIC MOLECULES FOR ORGANIC MOLECULAR MEMORIES

(75) Inventors: Tsukasa Tada, Tokyo (JP); Hideyuki Nishizawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 13/602,673

(22) Filed: Sep. 4, 2012

(65) Prior Publication Data

US 2013/0234089 A1   Sep. 12, 2013

(30) Foreign Application Priority Data

Nov. 30, 2011   (JP) ................. 2011-263099

(51) Int. Cl.
*H01L 35/24*   (2006.01)
(52) U.S. Cl.
USPC .................................... 257/40; 257/E51.001
(58) Field of Classification Search
USPC ............................................ 257/40, E51.001
See application file for complete search history.

(56) References Cited

U.S. PATENT DOCUMENTS 6,756,605 B1   6/2004   Reed et al.

FOREIGN PATENT DOCUMENTS

| JP | 2004-518268 | 6/2004 |
|----|-------------|--------|
| WO | 01/27972 A2 | 4/2001 |
| WO | 01/27972 A3 | 4/2001 |

OTHER PUBLICATIONS

Warren J. Hehre et al., "AB Initio Molecular Orbital Theory", A Wiley-Interscience Publication, 1986, pp. 86-88.
AEllen Frisch et al., "Gaussian 98 User's Reference", Gaussian, Inc., Jan. 1999, pp. 74, pp. 254.
Robert G. Parr et al., "Density-Functional Theory of Atoms and Molecules", Oxford University Press, 1989, pp. 142-149.
Chao Li, et al., "Fabrication approach for molecular memory arrays", Applied Physics Letters, vol. 82, No. 4, Jan. 27, 2003, pp. 645-647.
Axel D. Becke, "Density-functional thermochemistry. III. The role of exact exchange", J. Chem. Phys., vol. 98, No. 7, Apr. 1, 1993, pp. 5648-5652.
W. Kohn, et al., "Self-Consistent Equations Including Exchange and Correlation Effects", Physical Review, vol. 140, No. 4A, Nov. 15, 1965, pp. A1133-A1138.

*Primary Examiner* — Anthony Ho
(74) *Attorney, Agent, or Firm* — Oblon, Spivak, McClelland, Maier & Neustadt, L.L.P.

(57) ABSTRACT

An organic molecular memory of an embodiment includes: a first conductive layer; a second conductive layer; and an organic molecular layer that is provided between the first conductive layer and the second conductive layer, and contains an organic molecule selected from a group of molecules that simultaneously satisfy the following conditions (I) and (II) in a molecular system having a molecular frame with a π-electron system spreading along the molecular axis: (I) one of the highest occupied molecular orbital (HOMO) and the lowest unoccupied molecular orbital (LUMO) is delocalized along the molecular axis, and the other one is localized with respect to the molecular axis; and (II) the value of the energy level of the highest occupied molecular orbital (HOMO) is −5.75 eV or higher.

21 Claims, 16 Drawing Sheets

FIG.3
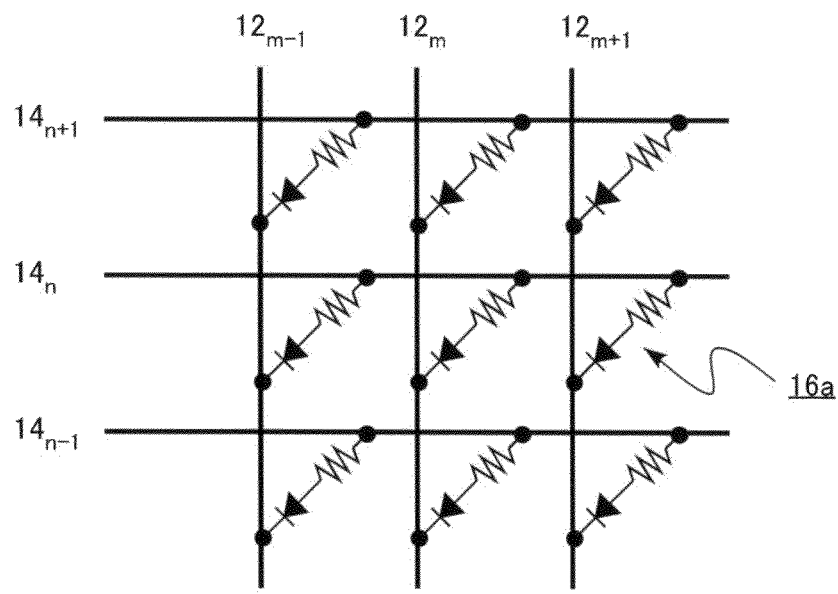
FIG.4A   LUMO (Molecule A) 75%
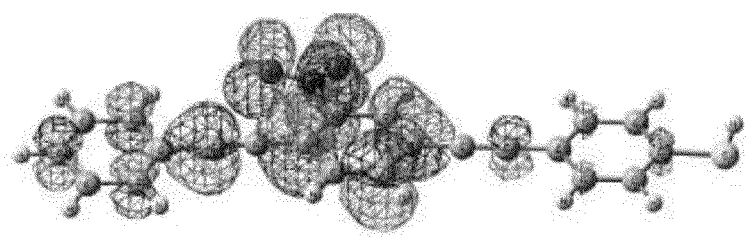
FIG.4B   HOMO (Molecule A) 100%
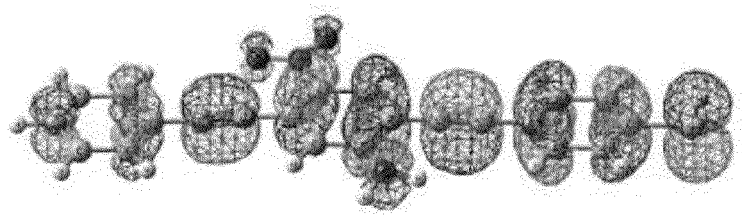

FIG.7A    LUMO (Molecule S1):74%
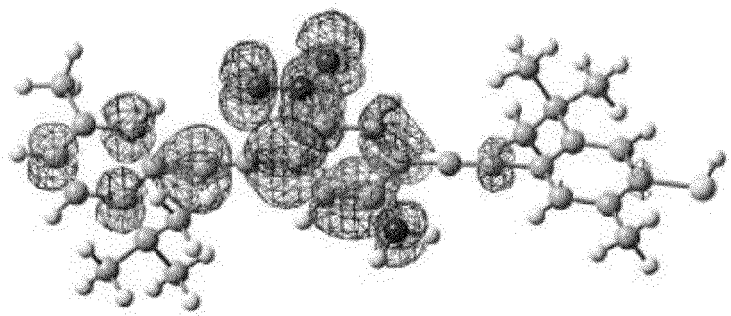
FIG.7B    HOMO (Molecule S1):100%
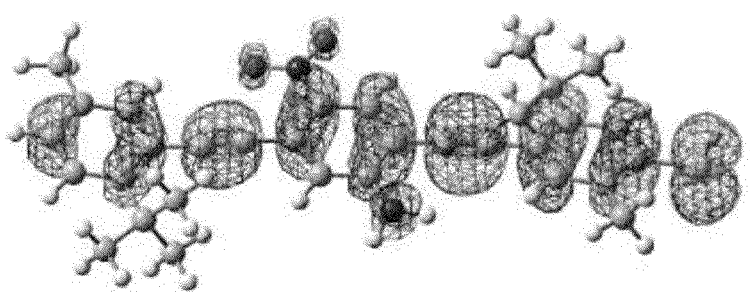
FIG.8A    LUMO (Molecule S2):73%
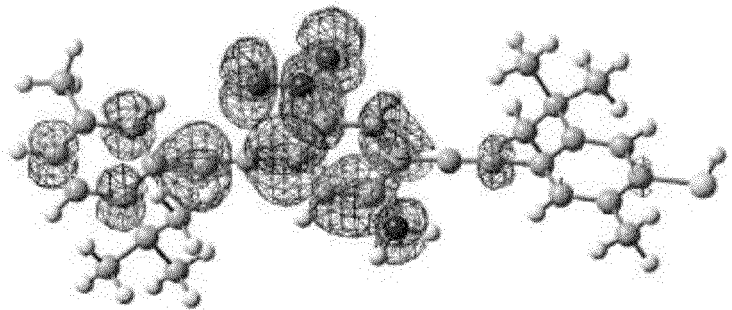
FIG.8B
         HOMO (Molecule S2):100%
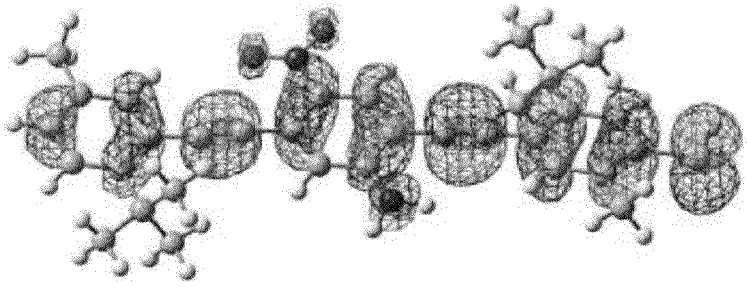

FIG.9A  LUMO (Molecule S3):82%
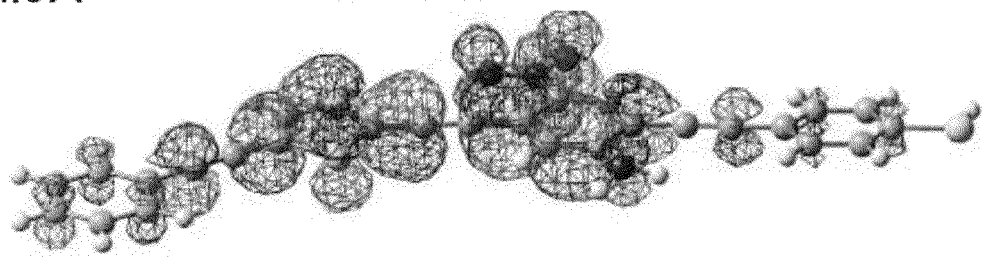
FIG.9B  HOMO (Molecule S3):100%
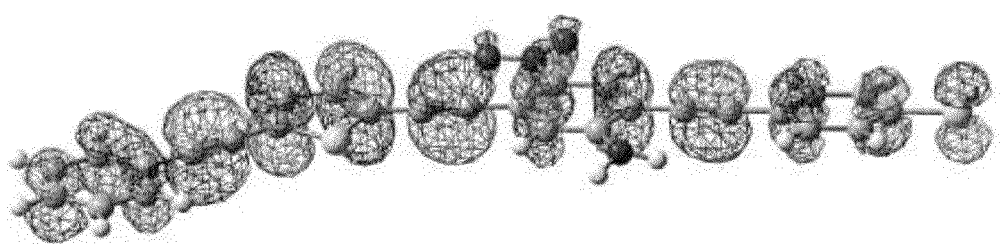
FIG.10A  LUMO (Molecule S4):74%
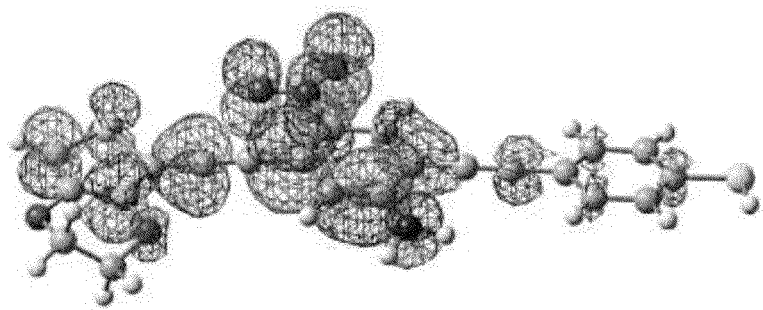
FIG.10B  HOMO (Molecule S4):100%
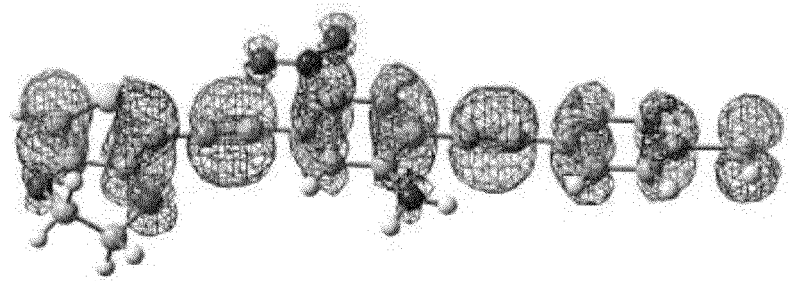

FIG.11A  LUMO (Molecule S5):79%
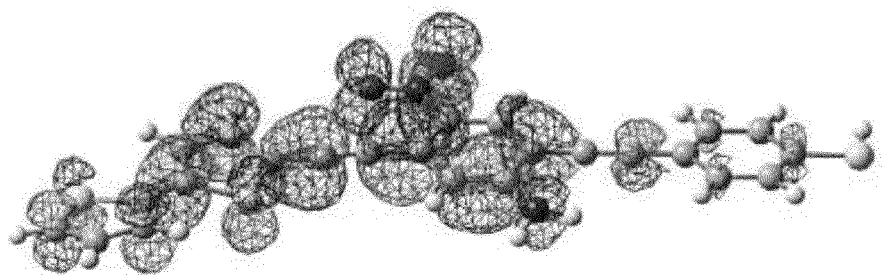
FIG.11B  HOMO (Molecule S5):100%
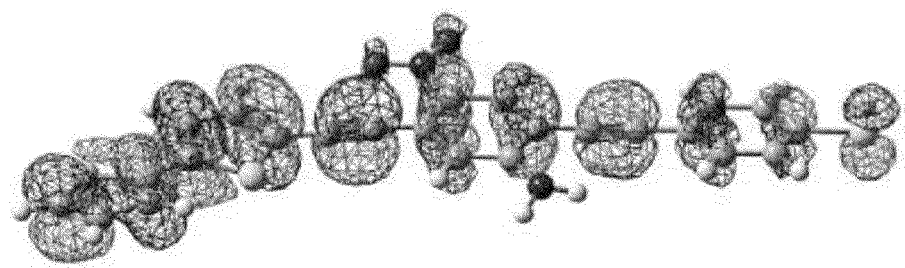
FIG.12A  LUMO (Molecule S6):84%
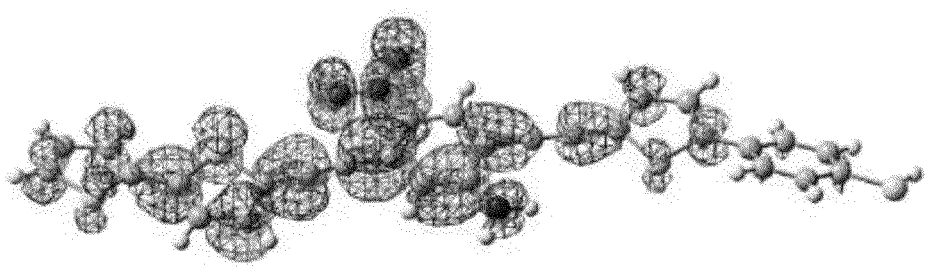
FIG.12B  HOMO (Molecule S6):100%
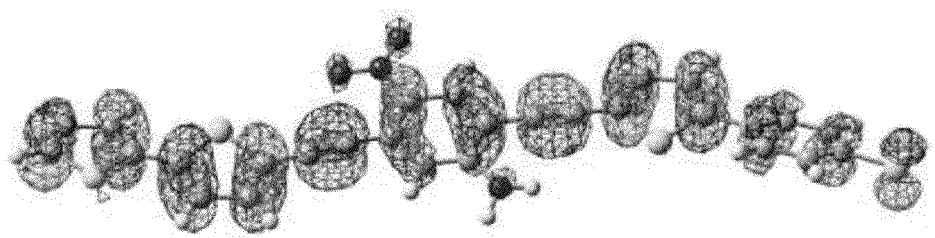

FIG.13A LUMO (Molecule S7) : 76%
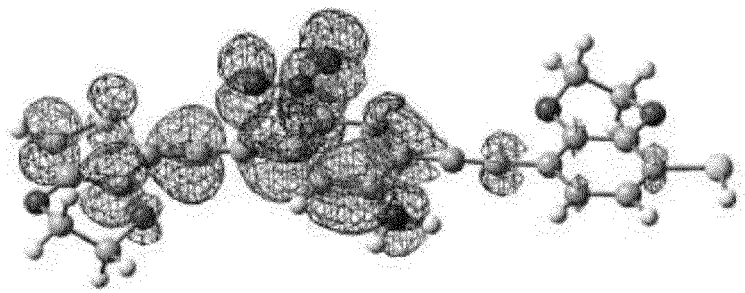
FIG.13B HOMO (Molecule S7) : 100%
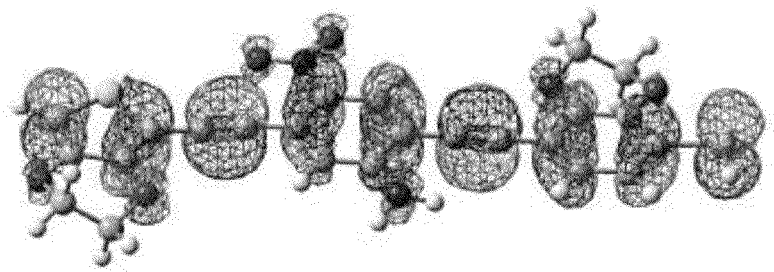
FIG.14A LUMO (Molecule S8) : 73%
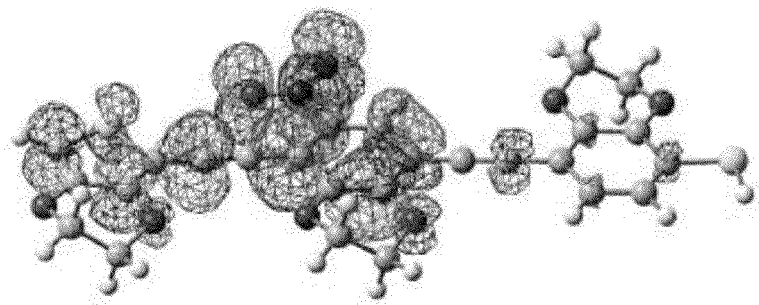
FIG.14B HOMO (Molecule S8) : 100%
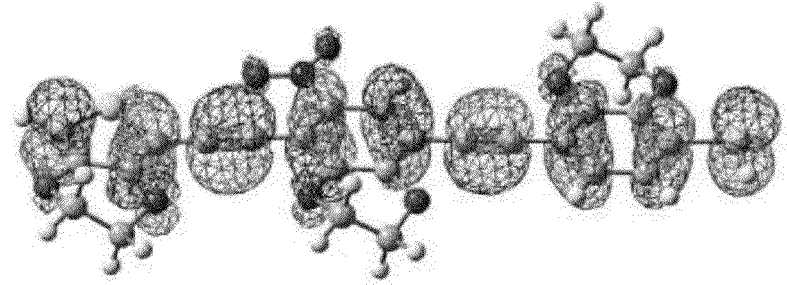

FIG.15A  LUMO (Molecule S9):82%
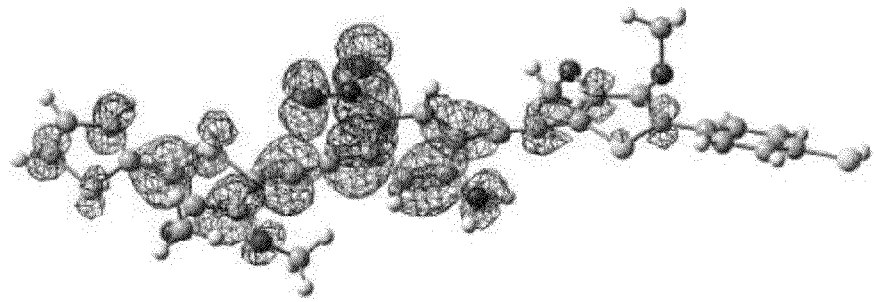
FIG.15B  HOMO (Molecule S9):100%
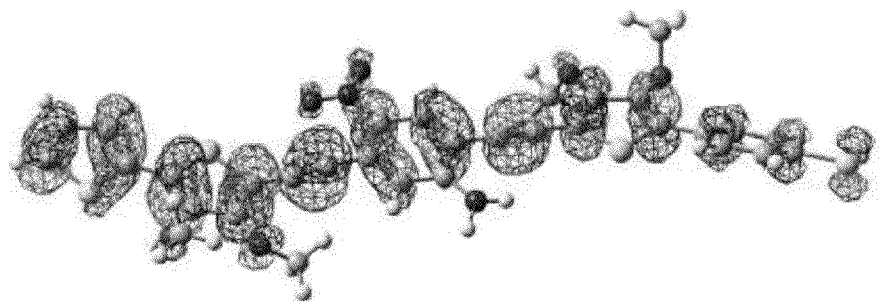
FIG.16A  LUMO (Molecule S10):82%
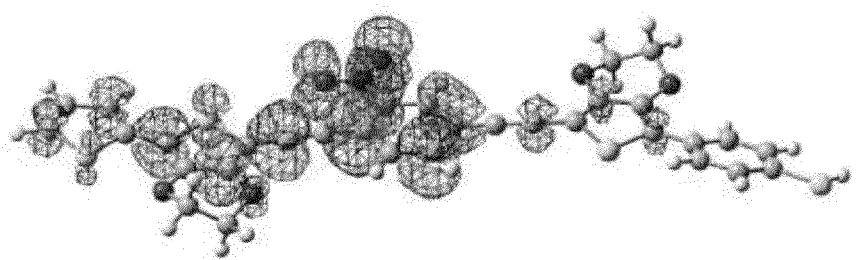
FIG.16B  HOMO (Molecule S10):100%
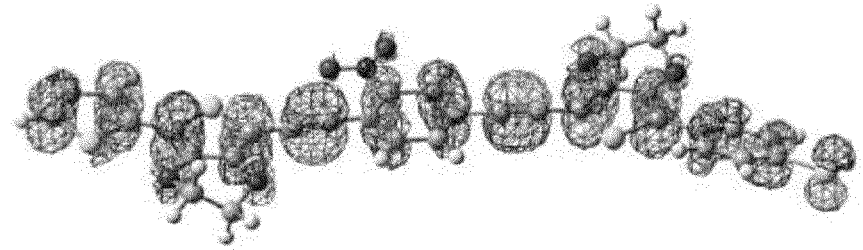

FIG.17A LUMO (Molecule S11):84%
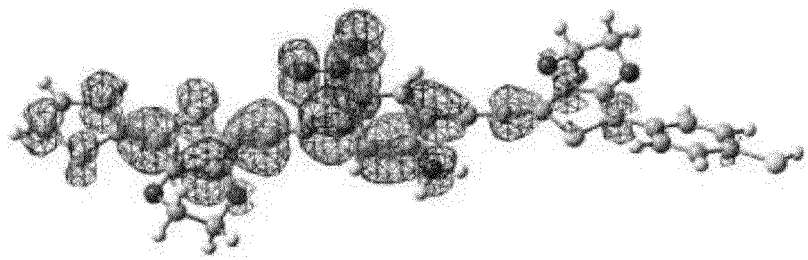
FIG.17B HOMO (Molecule S11):100%
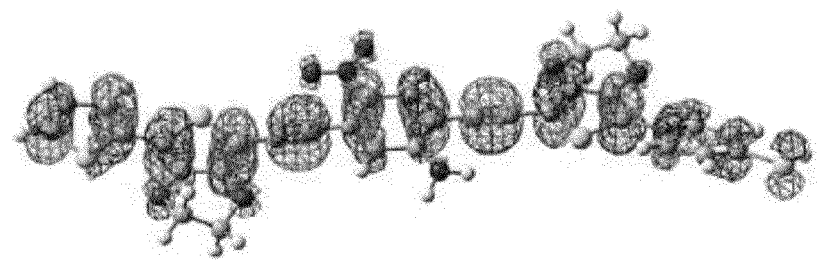
FIG.18A LUMO (Molecule T1):100%
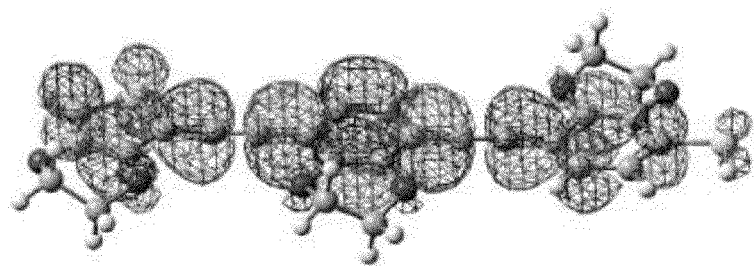
FIG.18B HOMO (Molecule T1):100%
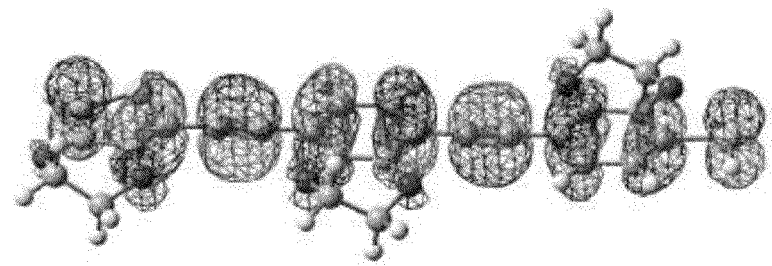

FIG.19A  LUMO (Molecule T2):100%
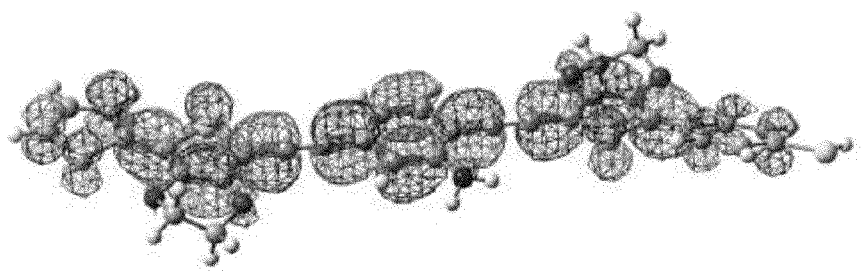
FIG.19B  HOMO (Molecule T2):100%
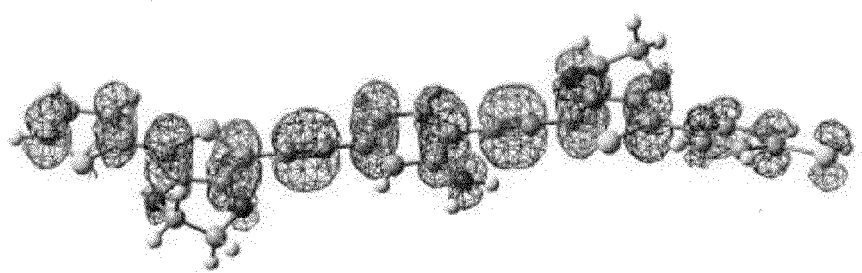

FIG.21A  LUMO (Molecule S12) : 100%
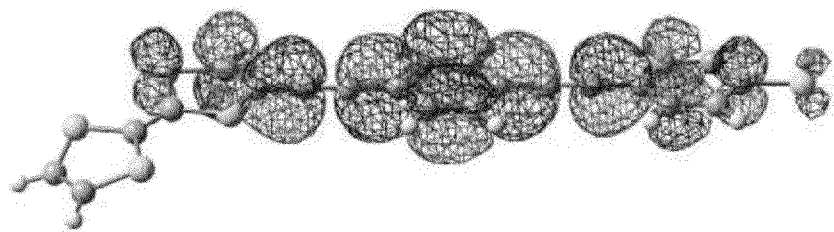
FIG.21B  HOMO (Molecule S12) : 31%
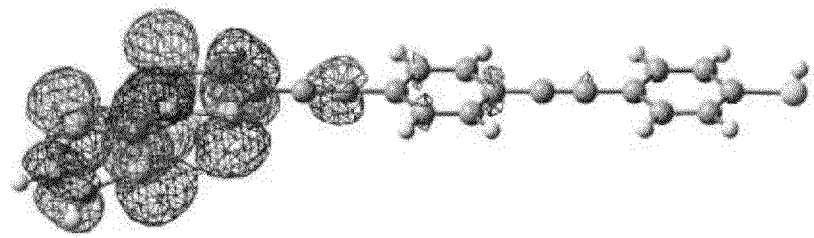

FIG.22A LUMO (Molecule S13) : 100%
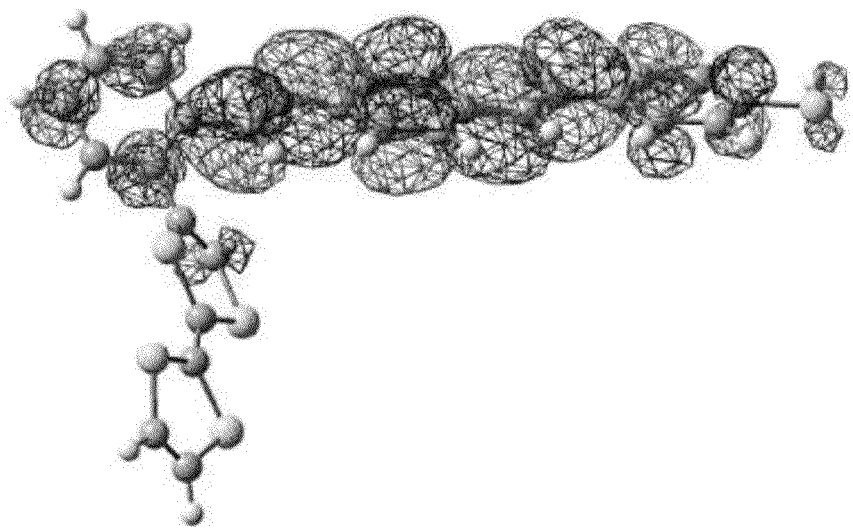
FIG.22B HOMO (Molecule S13) : 0%
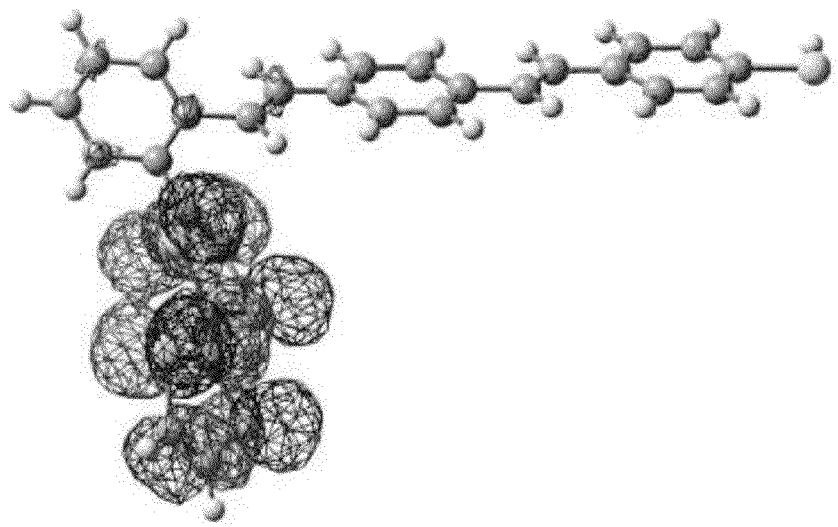

FIG.23A  LUMO (Molecule S14):100%
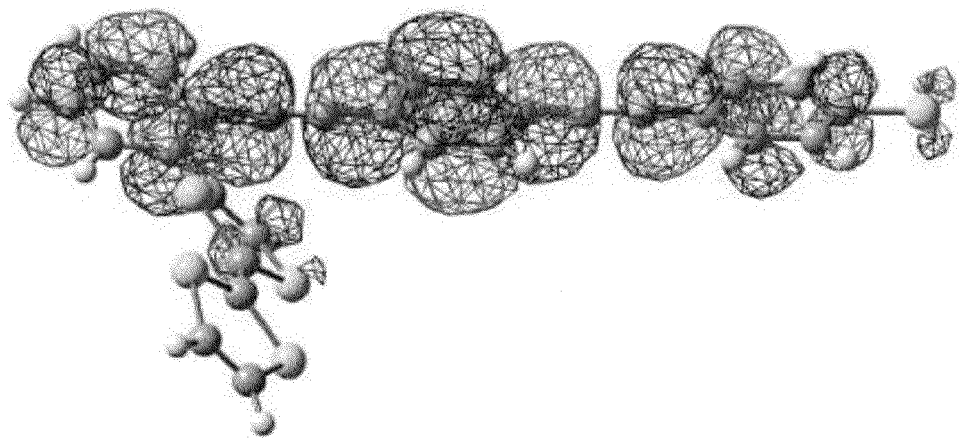
FIG.23B  HOMO (Molecule S14):0%
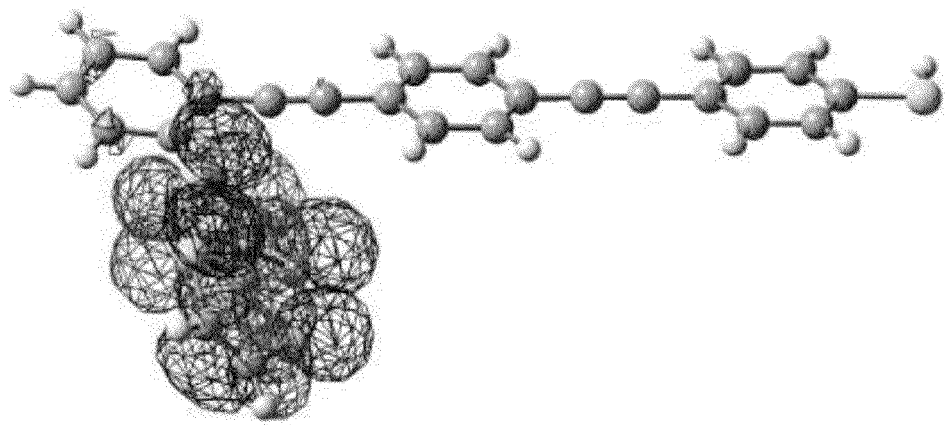

US 8,809,846 B2

ORGANIC MOLECULAR MEMORIES AND ORGANIC MOLECULES FOR ORGANIC MOLECULAR MEMORIES

CROSS-REFERENCE TO RELATED APPLICATION

This application is based upon and claims the benefit of priority from Japanese Patent Application No. 2011-263099, filed on Nov. 30, 2011, the entire contents of which are incorporated herein by reference.

FIELD

Embodiments described herein relate generally to organic molecular memories and organic molecules for organic molecular memories.

BACKGROUND

In recent years, the densities of storage elements and logical elements have been becoming higher through scaling. Integrated circuits have higher degrees of integration and higher capacities accordingly. This trend is conspicuous particularly among memory circuits.

However, it is predicted that, as long as the current fundamental structures of silicon (Si) memory devices are maintained, the scaling will soon reach its limit, and the increases in the memory chip density and capacity will stop.

To overcome the limit, an organic molecular memory that is a novel memory device using a single molecule or a molecular assembly as a memory element has been suggested, and test production of such organic molecular memories has been reported. As already reported, by using such organic molecular memories, a much higher density, a much higher degree of integration, and a much lower power consumption can be realized, compared with a case where conventional silicon devices are used.

In a memory element, a certain memory retention time is required. Therefore, the memory retention characteristics of the organic molecules used in memory elements need to be improved. Particularly, in a case where the use as a nonvolatile memory is intended, a long memory retention time is required, and therefore, further improvement of the memory retention characteristics is expected.

BRIEF DESCRIPTION OF THE DRAWINGS

FIG. 3 is a circuit diagram of a memory cell portion of the first embodiment;
FIGS. 4A and 4B are diagrams showing the highest occupied molecular orbital (HOMO) and the lowest unoccupied molecular orbital (LUMO) of a molecule A;
FIGS. 7A and 7B are orbital diagrams of a molecule S1;
FIGS. 8A and 8B are orbital diagrams of a molecule S2;
FIGS. 9A and 9B are orbital diagrams of a molecule S3;
FIGS. 10A and 10B are orbital diagrams of a molecule S4;
FIGS. 11A and 11B are orbital diagrams of a molecule S5;
FIGS. 12A and 12B are orbital diagrams of a molecule S6;
FIGS. 13A and 13B are orbital diagrams of a molecule S7;
FIGS. 14A and 14B are orbital diagrams of a molecule S8;
FIGS. 15A and 15B are orbital diagrams of a molecule S9;
FIGS. 16A and 16B are orbital diagrams of a molecule S10;
FIGS. 17A and 17B are orbital diagrams of a molecule S11;
FIGS. 18A and 18B are orbital diagrams of a molecule T1;
FIGS. 19A and 19B are orbital diagrams of a molecule T2;
FIGS. 21A and 21B are orbital diagrams of a molecule S12;
FIGS. 22A and 22B are orbital diagrams of a molecule S13;
FIGS. 23A and 23B are orbital diagrams of a molecule S14;

DETAILED DESCRIPTION

Figure 1:
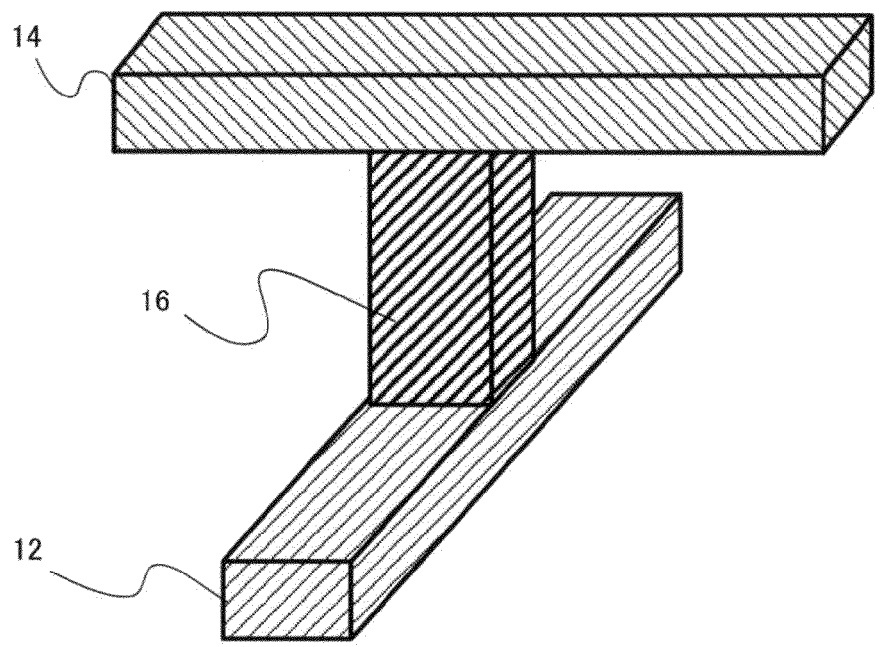
FIG. 1 is a schematic perspective view of an organic molecular memory of a first embodiment.

An organic molecular memory of an embodiment includes: a first conductive layer; a second conductive layer; and an organic molecular layer that is provided between the first conductive layer and the second conductive layer, and contains an organic molecule selected from a group of molecules that simultaneously satisfy the following conditions (I) and (II) in a molecular system having a molecular frame with a π-electron system spreading along the molecular axis.

(I) One of the highest occupied molecular orbital (HOMO) and the lowest unoccupied molecular orbital (LUMO) is delocalized along the molecular axis, and the other one is localized with respect to the molecular axis among the group of molecules.

(II) The value of the energy level of the highest occupied molecular orbital (HOMO) is −5.75 eV or higher among the group of molecules.

An organic molecular memory is formed with a two-terminal organic molecular memory in which both ends of a single molecule or the upper and lower surfaces of a monomolecular film that is a molecular assembly are joined to electrodes, for example. A low resistance and a high resistance between which the molecular resistance switches are associated with 0 and 1 in the memory, to develop a memory function. Samples of two-terminal devices of conductive molecules have been manufactured, and there have been reports on development of a memory function utilizing the resistance changes and on various kinds of memory characteristics such as the number of write-erase times and the memory retention time.

It has been confirmed that such a memory device using an organic molecule functions not only as a molecular assembly but also as a single molecule in principle. Accordingly, such a memory device has a superior scalability as an integrated circuit, and can have a much higher density and capacity than a conventional silicon device.

Meanwhile, a certain memory retention time is required in an organic molecular memory. Particularly, to be used as a nonvolatile memory, an organic molecular memory needs to have a long memory retention time. If the memory retention time is short, a certain memory function is maintained, but applications of the memory are limited.

In a case of an already reported memory element, the memory retention time remains within the range of several tens to several hundreds of seconds. Therefore, the range of application is limited, though there is a possibility to achieve a high density, a high integrity, and a high capacity as an integrated circuit. Such a memory element does not adequately serve as a nonvolatile memory that is required to have an even higher capacity in the future. In other words, as things are now, the advantages of organic molecular memories are not fully utilized to dramatically improve the density, capacity, and power saving ability.

Therefore, to apply organic molecular memories to a wide variety of memories including nonvolatile memories, there is a demand for an even larger increase in memory retention time.

Meanwhile, if a memory element has a certain memory retention time or longer, the memory element can be applied to the corresponding fields. However, the required memory retention time varies depending on each purpose of use, and in view of that, the required memory retention time is not necessarily fixed. With the above point being taken into account, a memory element that can be applied to a wide variety of fields including nonvolatile memories can be arbitrarily designed, if the memory retention time can be freely controlled to some extent according to the use of the memory by adjusting the structural design including the molecular structures while a fundamental memory element structure is maintained.

In the embodiments, organic molecular memories that excel in memory retention characteristics, and organic molecules for the organic molecular memories are described.

In this specification, the highest occupied molecular orbital (HOMO) or the lowest unoccupied molecular orbital (LUMO) is expressed as "localized" or "delocalized". The term "localized" means that the principal distribution region ratio of the molecular orbital along the molecular axis is at least 90% or lower with respect to the molecular axis in the molecular orbital distribution in which the molecular orbital calculated by a molecular orbital calculation according to a predetermined method described below is expressed by the equal amplitude intensity surface of 0.02 au (atomic unit).

Here, the molecular orbital calculation according to the predetermined method is a molecular orbital calculation performed under the following conditions. That is, in a molecular orbital calculation performed by LCAO (Linear Combination of Atomic Orbital) approximation:

(1) A 6-31+G(d) base is used as the base function system;

(2) The molecular orbital function and the one-electron energy level are calculated by the Kohn-Sham DFT using B3LYP hybrid exchange-correlation functional; and (3) The calculated value of the above one-electron energy level is a calculated value in a structure in which the molecule has the minimum energy on a Born-Oppenheimer potential energy surface.

The value of the energy level of the highest occupied molecular orbital (HOMO) in this specification is specified as a value calculated according to the same method as the above described molecular orbital calculation.

Additionally, in this specification, the principal distribution region ratio means the proportion of the length of the principal distribution region of the molecular orbital to the entire length of the molecular axis. Here, the molecular axis is the axis connecting the atoms at the terminals of cyclic compounds at both ends of a molecule or the axis of a region having substantially linear structure in between the terminals of a molecule. The principal distribution region of a molecular orbital is defined as the region in which the p orbital amplitude is 0.5 or greater in a case where the amplitude of the p orbital having the greatest amplitude among the p orbitals constituting the molecular orbital is 1. The amplitude of a p orbital is specified as the length of the p orbital principal axis surrounded by the equal amplitude intensity surface in a case where the molecular orbital is expressed by the equal amplitude intensity surface of 0.02 au (atomic unit).

Additionally, in this specification, "chemical binding" is a concept indicating covalent binding, ion binding, or metallic binding, but is not a concept indicating hydrogen binding or binding by van der Waals' forces.

Additionally, in this specification, the width of a "air gap" means the distance between an electrode (a conductive layer) and an end of an organic molecule forming the organic molecular layer facing the electrode. More specifically, the width of an "air gap" is a concept indicating the distance between an electrode surface and the gravity center of hetero atoms such as carbon (C) atoms, oxygen (O) atoms, nitrogen (N) atoms, or sulfur (S) atoms at a terminal portion of an organic molecule. The "air gap" may be vacuum, or the air or some other gas may exist in the "air gap".

First Embodiment

An organic molecular memory of this embodiment includes: a first conductive layer; a second conductive layer; and an organic molecular layer that is provided between the first conductive layer and the second conductive layer, and contains an organic molecule selected from a group of molecules that simultaneously satisfy the following conditions (I) and (II) in a molecular system having a molecular frame with a π-electron system spreading along the molecular axis.

(I) One of the highest occupied molecular orbital (HOMO) and the lowest unoccupied molecular orbital (LUMO) is delocalized along the molecular axis, and the other one is localized with respect to the molecular axis among the group of molecules.

(II) The value of the energy level of the highest occupied molecular orbital (HOMO) is −5.75 eV or higher among the group of molecules.

According to this embodiment, one of the HOMO and the LUMO of the organic molecule contained in the organic molecular layer is localized, and the other one is delocalized, so that two different conductance (resistance) states are realized. An organic molecular memory can be realized by utilizing the two states. An organic molecule having a function to cause the resistance to vary in this manner is also referred to as a variable-resistance molecular chain.

Further, as the energy level of the highest occupied molecular orbital of the organic molecule in the organic molecular layer has a value of −5.75 eV or greater, the electrons in the conductive layers (electrodes) do not easily return to the HOMO level of the organic molecule in the organic molecular layer, and the memory retention time is increased.

Figure 2:
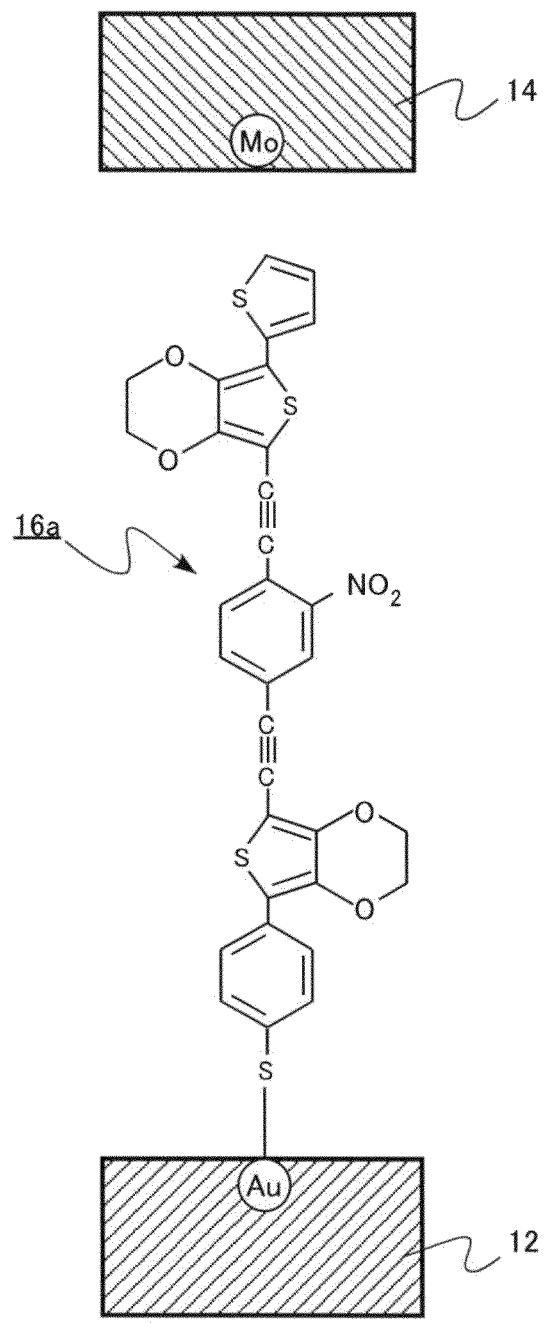
FIG. 2 is a diagram showing an example molecular structure of the organic molecule in a memory cell portion of the first embodiment.

FIG. 1 is a schematic perspective view of the organic molecular memory of this embodiment. FIG. 2 is a diagram showing an example molecular structure of the organic molecule in a memory cell portion. FIG. 3 is a circuit diagram of a memory cell portion.

The molecular memory of this embodiment is an organic molecular memory of a cross-point type. As shown in FIG. 1, a lower electrode interconnect (the first conductive layer) 12 is provided on an upper portion of a substrate (not shown), for example. An upper electrode interconnect (the second conductive layer) 14 is provided to be perpendicular to the lower electrode interconnect 12. The rules in design of the electrode interconnects specify 5 to 20 nm, for example.

As shown in FIG. 1, an organic molecular layer 16 is provided at an intersection portion between the lower electrode interconnect 12 and the upper electrode interconnect 14. Variable-resistance molecular chains 16a form the organic molecular layer 16. The thickness of the organic molecular layer 16 is 1 to 20 nm, for example.

As shown in FIG. 3, the organic molecular layer 16 is provided at each of the intersection points between lower electrode interconnects (word lines) 12 and upper electrode interconnects (bit lines) 14 in the same manner as in FIG. 1, for example, to form memory cells. With this arrangement, a memory cell array formed with memory cells is realized.

The variable-resistance molecular chains 16a of this embodiment have diode characteristics as later described, and the diode characteristics are sufficient for memory operations. Therefore, there is no need to additionally connect a device having diode characteristics to the variable-resistance molecular chains 16a. In a case where variable-resistance devices that do not have diode characteristics or do not have sufficient diode characteristics are used as memory cells, the circuit structure illustrated in FIG. 3 can be realized by connecting devices having diode characteristics are additionally connected to the variable-resistance molecular chains.

The organic molecular layer 16 of this embodiment is formed with the variable-resistance molecular chains 16a, for example. At least one end of the variable-resistance molecular chains 16a is chemically bound to the lower electrode interconnect 12. The variable-resistance molecular chains 16a extend from the lower electrode interconnect 12 toward the upper electrode interconnect 14.

The lower electrode interconnect 12 is formed on a silicon (Si) substrate (not shown) having the (110) plane as a surface. The lower electrode interconnect 12 is made of a metallic material such as gold (Au). The face of the lower electrode interconnect 12 in contact with the organic molecular layer 16 is the (111) plane, for example. The upper electrode interconnect 14 is made of a metallic material such as molybdenum (Mo).

The variable-resistance molecular chains 16a forming the organic molecular layer 16 of this embodiment have a molecular structure as illustrated in FIG. 2, for example.

The variable-resistance molecular chain illustrated in FIG. 2 includes a thiol group as a reactive functional group called a linker at one end prior to the binding to the electrode. Sulfur atom (S) are chemically bound to gold atoms (Au) in the surface of the lower electrode interconnect 12. Here, "linker" means a site that secures a molecule to an electrode (a conductive layer) through chemical binding. The variable-resistance molecular chain 16a of FIG. 2 prior to the binding is equivalent to the later described molecule S10.

Gold atoms in the surface of the lower electrode interconnect 12 and thiol groups are bound together in this manner, to form each organic molecular layer 16 that is a so-called self-assembled monolayer (SAM). Meanwhile, the benzene ring at the other end of the variable-resistance molecular chain 16a is not chemically bound to molybdenum (Mo) atoms in the surface of the upper electrode 14.

That is, the other end of the variable-resistance molecular chain 16a is physically adsorbed to the other conductive layer, or an air gap exists between the other end of the variable-resistance molecular chain 16a and the other conductive layer. The width of the air gap is preferably 0.3 nm or smaller, so as to restrain increases in resistance.

Here, each variable-resistance molecular chain 16a is a molecular chain having a function to change its resistance, depending on whether an electric field exists or whether charges are injected thereinto. For example, each variable-resistance molecular chain having the molecular structure illustrated in FIG. 2 can switch between a low-resistance state and a high-resistance state through voltage application between both ends. Such changes in the resistance state are used to realize a memory cell.

Conventionally, the most often reported molecule as a molecule used in an organic memory is a molecule (molecule A) expressed by the following molecular structural formula (A) and has a particular structure and a particular electronic state. Here, a SH group is a reactive functional group to be bound to an electrode. The molecule A is a variable-resistance molecular chain, and is also called a "Tour wire".

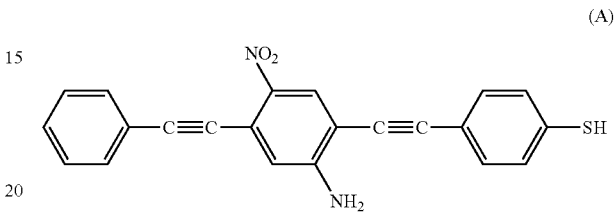

(A)

FIGS. 4A and 4B are diagrams showing the highest occupied molecular orbital (HOMO) and the lowest unoccupied molecular orbital (LUMO) of the molecule A. FIG. 4A shows the LUMO, and FIG. 4B shows the HOMO.

The molecule A has the characteristics unique to the highest occupied molecular orbital (HOMO) and the lowest unoccupied molecular orbital (LUMO), which are the frontier orbitals of the molecule A, and the HOMO and the LUMO calculated by a molecular orbital method are the orbitals illustrated in FIGS. 4A and 4B. That is, the HOMO is delocalized along the molecular axis and spreads along the entire molecular axis, while the LUMO is asymmetrically localized at a portion on the left side of the molecular axis.

The left and right portions of the molecule A are joined to electrodes. When current is applied, the dominant pathway through which electrons travel varies depending on the charge state of the entire molecule A. A molecular orbital which has closest energy level to that of Fermi level of an electrode (usually HOMO or LUMO) plays an important role in charge transfer when relatively low voltage is applied. Therefore, incase of the molecular group of embodiments that has high HOMO level and has relatively strong donor type nature, HOMO will be the orbital which has highest contribution to electron transfer and HOMO is likely to serve as a dominant transfer pathway of electrons. However, at positively charged state, levels of HOMO and LUMO largely decrease and LUMO level become closer to the Fermi level of the electrode. In such a state, LUMO is likely to serve as a dominant transfer pathway of electrons.

In view of the above, as the difference in the orbital distribution state between the LUMO and HOMO becomes larger, the conductance change (resistance change) between the neutral charge state and the positive charge state becomes larger. Particularly, in a case where one of the HOMO and the LUMO is delocalized along the molecular axis, the conduction becomes almost coherent when electrons are transferred through the orbital, and a high conductance (a low resistance) is achieved.

If one of the orbitals does not spread along the entire molecular axis but is localized, the electron transfer efficiency becomes lower, and the conductance becomes lower. Particularly, if one of the molecular orbitals is localized asymmetrically about the molecular axis as illustrated in FIGS. 4A and 4B, an asymmetrical I-V curve can be easily realized. Therefore, asymmetry properties of the molecular orbital are an important factor in realizing a molecular memory element having rectification properties. In view of that, the molecular orbital is preferably localized in an asymmetrical manner.

The charge state of a molecule having a particular electron state as described above is alternately switched between the two states of a neutral charge state and a positive charge state by controlling application of a pulse voltage or the like. As a result, the molecule has two different conductances. The two different conductances are associated with "0" and "1" in the memory, to realize a two-terminal molecular memory element that has the molecule joined to the left and right electrodes and has a rectifying function.

In a case where the organic molecule has a sufficient rectifying function, the memory function can be realized in the organic molecular memory of the cross-point type illustrated in FIG. 1, without an addition of a diode device, for example. Accordingly, the density of organic molecular memories is suitably increased, and the costs are suitably lowered.

Figure 5:
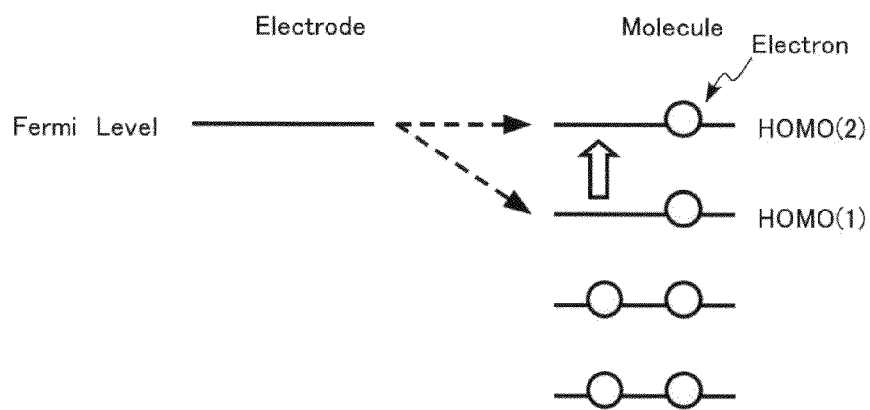
FIG. 5 is a diagram for explaining the memory retention time in the organic molecular memory.

FIG. 5 is a diagram for explaining the memory retention time in the organic molecular memory. In the molecule A, for example, a conductance varying state does not last long, and the memory retention time is as short as several tens to several hundreds of seconds.

This is because, even if the conductance is varied after a positive charge state starts, electrons on the Fermi level of the electrode return to the HOMO level of the molecule in the positive charge state in a short time, and the molecule returns to the original neutral charge state, as illustrated in FIG. 5. This is a phenomenon that occurs due to the high transfer rate of electrons from the Fermi level of the electrode back to the HOMO level of the molecule. If the electron transfer rate becomes lower by one digit, for example, the memory retention time becomes longer by one digit. Accordingly, by lowering the transfer rate of electrons from the electrode to the molecule, the memory retention time can be made longer.

The transfer rate of electrons from the Fermi level of the electrode back to the HOMO level in the positively charged state exponentially increases as the difference between the Fermi level and the HOMO level increases. Studies made by the inventors have made it apparent that the memory retention time can be made longer by lowering the electron transfer rate in the following manner. The conventional HOMO level is made higher by modifying the molecular structure, so that the difference between the Fermi level and the HOMO level is reduced.

In FIG. 5, the memory retention time becomes longer by switching the HOMO level from the energy level of HOMO (1) to the energy level of HOMO (2).

Meanwhile, not all memory devices are required to have a memory retention time as long as that of a nonvolatile memory, and the required memory retention time varies with the use of each memory. Even in such circumstances, an organic molecular memory that has a retention time suitable for the use of the memory can be provided by controlling the HOMO level of the molecule.

To realize an organic molecular memory having a long memory retention time, however, not only the HOMO level of the molecule needs to be controlled, but also the organic molecule used in the device needs to satisfy the following condition (X). More preferably, the organic molecule further satisfies the condition (Y).

Condition (X): the molecule has a reproducible hysteresis function.

Condition (Y): the molecule has asymmetrical I-V characteristics, and has a rectifying function.

That is, to realize an organic molecular memory having a long memory retention time and provide an organic molecular memory that has a memory retention time that can be controlled by modifying the molecular structure and be varied with use, the HOMO level needs to be increased, and the increase needs to be controlled, while the condition (X) is satisfied. Further, it is more preferable to increase the HOMO level while satisfying the condition (Y).

The condition (X) is satisfied, where one of the highest occupied molecular orbital (HOMO) and the lowest unoccupied molecular orbital (LUMO) is delocalized along the molecular axis, and the other one is localized with respect to the molecular axis. The condition (Y) is satisfied, where one of the HOMO and the LUMO is localized asymmetrically about the molecular axis.

According to this embodiment, the principal component of the organic molecular layer is a single molecule or a molecular assembly that is bound to or in contact with an electrode (a conductive layer). The single molecule or the molecular assembly is selected from a group of molecules that simultaneously satisfy the following conditions (I) and (II), and more preferably, satisfy the condition (III), in a molecular system having a molecular frame with a π-electron system extending along the molecular axis. With this arrangement, both a memory function using resistance changes, and a longer memory retention time can be achieved.

(I) One of the highest occupied molecular orbital (HOMO) and the lowest unoccupied molecular orbital (LUMO) is delocalized along the molecular axis, and the other one is localized asymmetrically or symmetrically about the molecular axis among the group of molecules.

(II) The value of the energy level of the highest occupied molecular orbital is −5.75 eV or higher among the group of molecules.

(III) The molecules in the group have π-electrons selected from the group (i) or (ii) of molecules.

(i) A group of molecules having a core structure that is a particular structure expressed by the following general formula (1), and having a reactive functional group for binding to the first conductive layer or the second conductive layer.

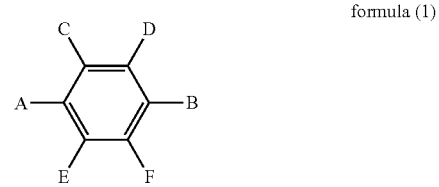

formula (1)

In the above general formula (1), C, D, E, and F represent substituent groups selected from the group (a) shown below or hydrogen atoms, and A and B represent molecular structures selected from the structures listed in the group (b) shown below.

(a) $NO_2$, CN, F, COOH, COOR, $SO_3H$, $SO_3R$, $NH_2$, $NR_2$, OH, OR, and R. Here, R is an alkyl group.

(b) A phenyl ring, a thiophene ring, a pyrrole ring, a furan ring, a pyridine ring, a pyrazine ring, a carbazole ring, a xanthene ring, a quinoline ring, an isoquinoline ring, and an acridine ring, respective substituent-modified structures of those rings, and coupled structures formed by coupling those rings via predetermined unit structures. Here, the predetermined unit structures are structures selected from C—C coupling units, ethylene double coupling units (C═C), and acetylene C—C triple coupling units.

(ii) A group of molecules having a core structure that is a molecular system formed by substituent-modifying polycyclic aromatic hydrocarbons expressed by the following formulas (C1) through (C16) or π-electron frame molecules formed by substituting part of the carbon (C) of the hydrocarbons with nitrogen (N), or coupled structures in which the above molecules are bound via predetermined unit structures, with a substituent group selected from the group (a), A reactive functional group for binding to the first conductive layer or the second conductive layer is bound to the core structure. Here, the predetermined unit structures are structures selected from a C—C coupling unit, an ethylene double coupling unit (C=C), and an acetylene C—C triple coupling unit.

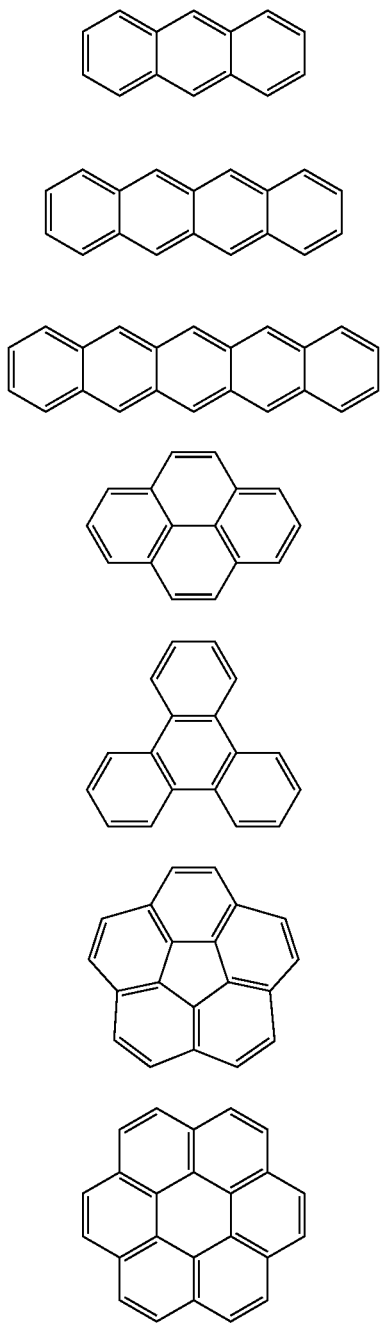

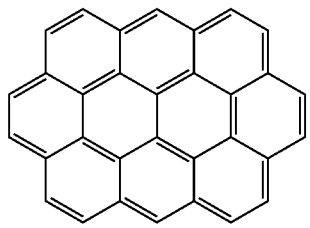

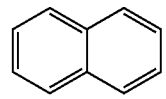

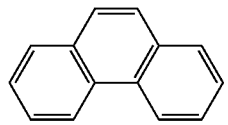

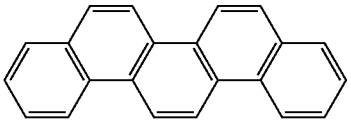

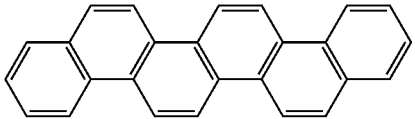

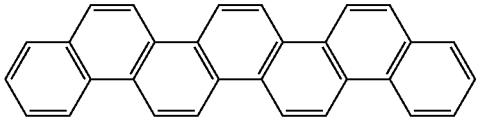

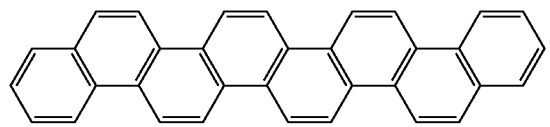

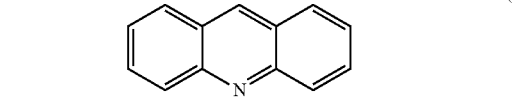

In the general formula (1), A and B are preferably the structures expressed by the following formulas (B1) through (B16) (in the formulas, C, D, E, and F represent substituent groups selected from the group (a), R being an alkyl group), fundamental structures formed by substituent-modifying those structures, or coupled structures formed by coupling those fundamental structures via predetermined unit structures. Here, the predetermined unit structures are structures selected from a C—C coupling unit, an ethylene double coupling unit (C=C), and an acetylene C—C triple coupling unit.

(B1) 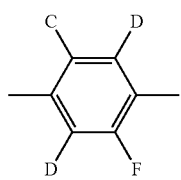

(B2) 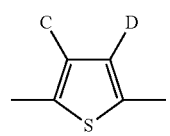

(B3) 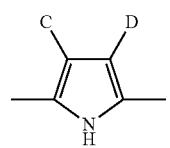

(B4) 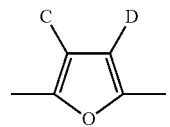

(B5) 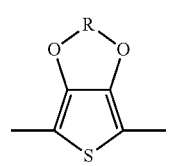

(B6) 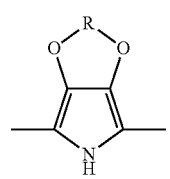

(B7) 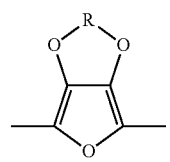

(B8) 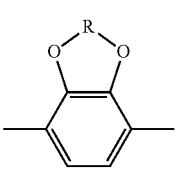

-continued (B9) 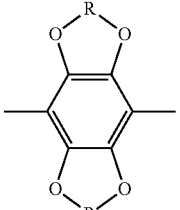

(B10) 

(B11) 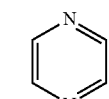

(B12) 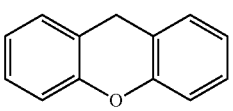

(B13) 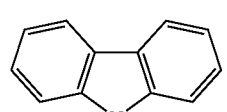

(B14) 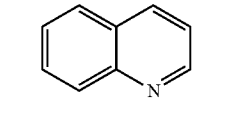

(B15) 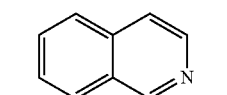

(B16) 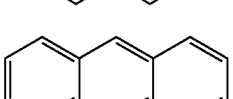

In the group of molecules specified above in (i), an alkyl group is preferably provided between the above described core structure and the above described reactive functional group. In the group of molecules specified above in (ii), an alkyl group is preferably provided between the above described molecular system and the above described reactive functional group.

Next, the three conditions (I), (II), and (III) are described in greater detail. The condition (I) is set as the requirement for causing a conductance change in accordance with a charge state change such as a change from a neutral charge state to a positive charge state to a neutral charge state.

Figure 6A:
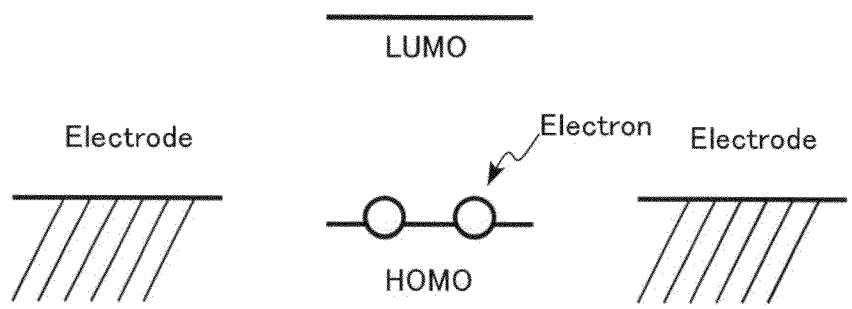
FIGS. 6A and 6B are diagrams for explaining electron transfers in organic molecules.
Figure 6B:
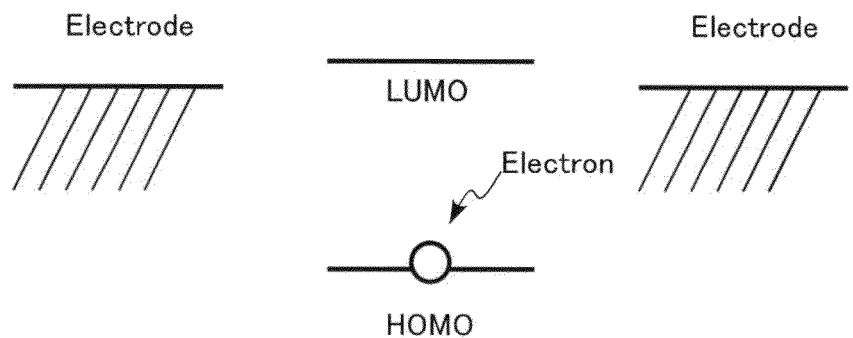

FIGS. 6A and 6B are diagrams for explaining transfers of electrons in an organic molecule. FIG. 6A illustrates a case where the molecule maintains a neutral charge state, and FIG. 6B illustrates a case where the molecule enters a positive charge state.

As shown in FIG. 6A, at the neutral charge state, HOMO level has the closest energy level to Fermi level of electrode in case of a molecule of this embodiment which has high HOMO level and relatively strong donor type nature. Therefore, HOMO has largest interaction with the Fermi level of the electrode and HOMO plays an important role in electron transfer. On the other hand, as shown in FIG. 6B, at the positively charged state, energy levels of molecule as a whole goes down. Then LUNG level becomes the closest energy level to Fermi level of electrode. Therefore, LUMO has largest interaction with the Fermi level of the electrode and LUMO comes to play an important role in electron transfer in turn.

If the HOMO and the LUMO are spatially the same wave functions, the same conductance is maintained both in the neutral charge state and in the positive charge state.

Therefore, to cause a change in molecule conductance when a change from a neutral charge state to a positive charge state occurs, the HOMO serving as the dominant conduction path in the neutral charge state and the LUMO serving as the dominant conduction path in the positive charge state are required to have different wave functions from each other. More specifically, the wave functions are required to be such that one of the LUMO and the HOMO is delocalized along the molecular axis, and the other one is localized.

As such an electron state is realized, a change in molecule conductance can be realized by changing the charge state from a neutral charge state to a positive charge state to a neutral charge state. The molecule A expressed by the structural formula (A) satisfies the condition (I), as the LUMO is localized while the HOMO is delocalized along the molecular axis, as illustrated in FIGS. 4A and 4B.

The group of molecules that can be used in the organic molecular memory of this embodiment does not necessarily have the HOMO delocalized like the molecule A, and those molecules satisfy the requirement for having a resistance varying function as long as one of the HOMO and the LUMO is delocalized.

Both the HOMO and the LUMO are preferably localized asymmetrically about the molecular axis rather than symmetrically about the molecular axis. This is because, asymmetric localization is more beneficial in generating an asymmetrical I-V curve, regardless of the manner of connection between the molecule and an electrode.

As illustrated in FIGS. 4A and 4B, the molecule A has the LUMO localized asymmetrically about the molecular axis, and has an orbital pattern that is desirable in generating an asymmetrical I-V curve. Actually, asymmetrical I-V characteristics are observed in a two-terminal organic molecular memory using the molecule A. However, the molecule A does not belong to the group of molecules that can be used in the organic molecular memory of this embodiment.

A molecule to be used in the organic molecular memory of this embodiment needs to further satisfy the above described condition (II). For example, a two-terminal organic molecular memory using the molecule A does not have a sufficient memory lifetime. Therefore, the use of the memory is limited to a narrow field, and the advantages of the variable-resistance molecular chain are not fully utilized.

This is because, even though the conductance is changed after the charge state is changed, the charge state is unstable and returns to the original charge state in a short time in a zero-bias state. According to this embodiment, the memory retention time can be made longer by increasing the stability of the changed charge state.

When a written memory retained state is lost, the electrons on the Fermi level of the electrode return to the HOMO level of the molecule in a positive charge state after writing, and return to the original conductance, as illustrated in FIG. 5. As the electron transfer rate or the electron transfer probability at the time of returning becomes lower, the memory retention time becomes longer.

The electron transfer rate increases in proportion to the difference between the Fermi level of the electrode and the HOMO level of the molecule. To stabilize a positive charge state is to use a molecule in a more stable positive charge state, and is equivalent to using a molecule inherently having a higher HOMO level.

By using a molecule having a higher HOMO level than a certain energy, the difference between the Fermi level of the electrode and the HOMO level of the molecule is reduced, and the speed or probability of the electron transfer from the electrode to the molecule becomes lower accordingly. Thus, the memory retention time of the organic molecular memory becomes longer, as illustrated in FIG. 5.

In view of this, by setting an appropriate HOMO level, a long memory retention time can be realized. Additionally, by appropriately controlling the HOMO level, an organic molecular memory having a memory retention time suitable for the use of the memory can be provided.

To specify a molecule having such characteristics, the value of a first ionization potential obtained through an experiment such as UPS, or the value of a first ionization potential obtained through a molecular orbital calculation according to a predetermined method can be used.

In a case where a value calculated through a molecular orbital calculation according to a predetermined method is used, the condition (II) can be specified by the value of the HOMO level obtained through the calculation. In this embodiment, the value calculated according to the predetermined method is used. In this manner, the condition (II) can be uniquely specified.

Here, the molecular orbital calculation according to the predetermined method is a molecular orbital calculation calculated under the following conditions. That is, in a molecular orbital calculation performed by LCAO (Linear Combination of Atomic Orbital) approximation:

(1) A6-31+G(d) base is used as the base function system;

(2) The molecular orbital function and the one-electron energy level are calculated by the Kohn-Sham DFT using B3LYP hybrid exchange-correlation functional; and (3) The calculated value is a calculated value in a structure in which the molecule have the smallest energy on a Born-Oppenheimer surface.

As for the details of this molecular orbital calculation, see Non-Patent Documents 2 through 6.

The condition (III) is a molecular structure requirement for satisfying the fundamental condition for forming an organic molecular memory in which the organic molecule used in this embodiment has relatively high electron conductivity, and at the same time, the molecular assembly easily forms a self-assembled monomolecular film.

For example, the group of molecules having the structure expressed by the general formula (1) has a basic skeleton that is a structure formed with molecular units that are adjacent to one another via particular units and have π-electron systems. Accordingly, a number of one-electron wave functions near the frontier orbital of the group of molecules are delocalized along the molecular axis, and relatively high electron conductivity can be realized by virtue of the existence of the delocalized π-electron systems.

Meanwhile, the substituent groups specified in the general formula (1) mainly function as required conditions for satisfying the conditions (I) and (II). However, not all the molecules satisfying the condition (III) can be used in the organic molecular memory, and the molecules that can be used in the organic molecular memory are limited to those simultaneously satisfying the conditions (I) and (II).

As described above in detail, by using an organic molecular layer containing as a principal component an organic molecule selected from a group of molecules that satisfy the conditions (I) and (II) and preferably also satisfy the condition (III), a longer memory retention time than a conventional memory retention time can be realized while the memory function to achieve conductance changes and an asymmetrical I-V curve is maintained. Accordingly, a novel organic molecular memory with dramatically increased usefulness can be provided.

Additionally, with the use of the organic molecular memory according to this embodiment, an organic molecular memory that has a memory time suitable for the use of the memory can be realized by appropriately controlling the HOMO level of the molecule. Accordingly, the field of use is dramatically widened with the organic molecular memory, and an organic molecular memory can be provided to fully utilize the advantages of an organic molecule in the field of memory products required to have particularly high capacities and densities.

The following is a description of the results of simulations performed to examine the relative memory retention times in cases where the HOMO level of the molecule in the organic molecular memory of this embodiment is increased, and a specific group of molecules and the characteristics thereof. In the following, excellent characteristics achieved by the organic molecular memory of this embodiment, such as increases in the memory retention time and the possibility to control the memory retention time, are also described.

In an organic molecular memory having the same structure as the above described two-terminal device using the molecule A, the same molecule-electrode junction as in the case of the molecule A is maintained even when the organic molecule is changed. The results of simulations performed to measure the memory retention time ratios achieved when the HOMO level of the molecule is increased are shown in Table 1. Table 1 shows the memory retention time ratios relative to the memory retention time achieved where the molecule A is used.

In the simulations, the transfer rate ratios between the transfer rate achieved when electrons transfer from the electrode to the HOMO level of the molecule that is positively charged and has one unoccupied orbital in a zero-bias state, and the transfer rate achieved when electrons transfer from the electrode to the conventional HOMO in a comparative molecule A that is also positively charged are calculated according to a method based on the transition state theory on electron transfer reactions, and further, the reciprocals of the electron transfer rate ratios are calculated as the memory retention time ratios.

Table 1 shows the results of simulations performed to measure the memory retention times of the two-terminal device when the HOMO level of the molecule is increased.

As shown in Table 1, the memory retention time increases as the HOMO level of the molecule becomes higher. The memory retention time slowly increases until when the HOMO level increases by approximately +0.2 eV. However, the memory retention time increases by almost two digits with an increase of 0.45 eV in the HOMO level, and thereafter, increases exponentially.

In view of the above, by using a molecule having a sufficiently high HOMO level, the memory retention time is increased, and a nonvolatile memory can be realized. Additionally, since the memory retention time can be controlled by controlling the HOMO level, an organic molecular memory that has a memory retention time suitable for the use of the memory can be provided by selecting a molecule having an appropriate HOMO level.

TABLE 1

| HOMO level (eV) | Memory retention time ratio |
| --- | --- |
| −5.85 (Molecule A) | 1.0 |
| −5.70 | 1.31 |
| −5.60 | 3.23 |
| −5.50 | 14.25 |
| −5.40 | 112.16 |
| −5.30 | 1575.51 |
| −5.25 | 7338.28 |
| −5.20 | 39507.98 |
| −5.15 | 245862.33 |
| −5.10 | 1768543.40 |

As shown in the above simulation results, the organic molecular memory provided by this embodiment realizes a longer memory retention time than that achieved by the organic molecular memory using the molecule A. For example, where the HOMO level is −5.70 eV, the achieved memory retention time is 1.3 times longer than that in the case where the molecule A is used. As described above, the organic molecule used in this embodiment is selected from a group of molecules that satisfy the conditions (I) and (II), and preferably also satisfy the condition (III) at the same time.

Specific examples of molecular structures of organic molecules that simultaneously satisfy the conditions (I), (II), and (III) are shown below as molecules S1 through S11 expressed by molecular structural formulas (S1) through (S11). The group of molecules shown below as examples is formed with continuously coupled structures of units having π-electron systems. The units having π-electron systems are arranged along the molecular axis. This is a required condition for realizing the above described molecule conduction.

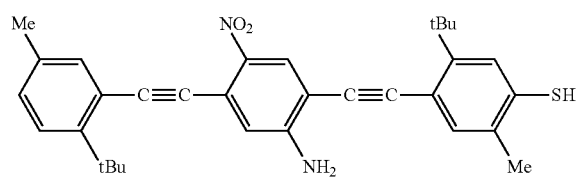

(S1)

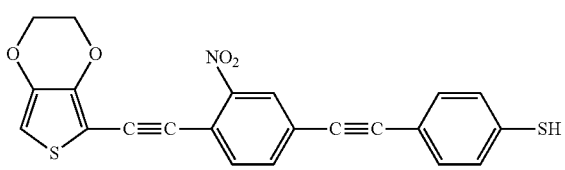

(S2)

-continued
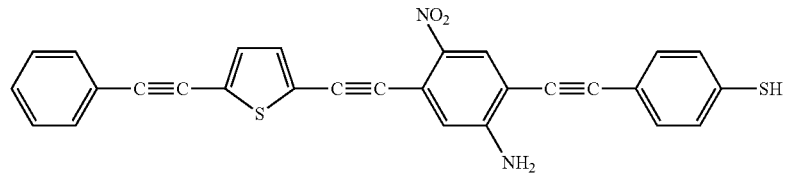
(S3)
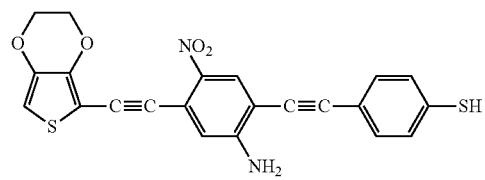
(S4)
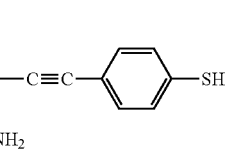
(S5)
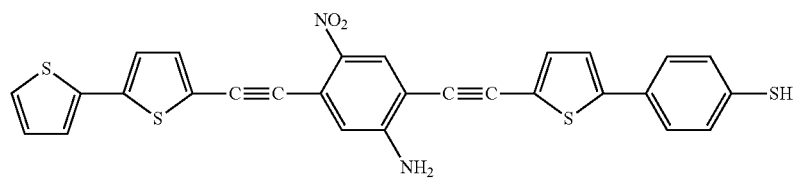
(S6)
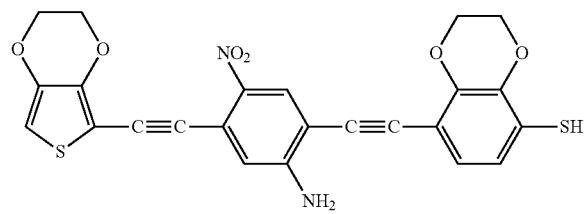
(S7)
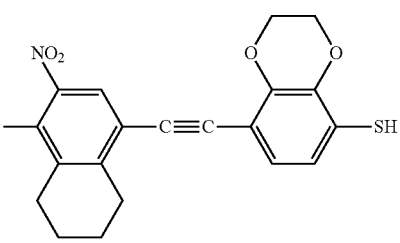
(S8)
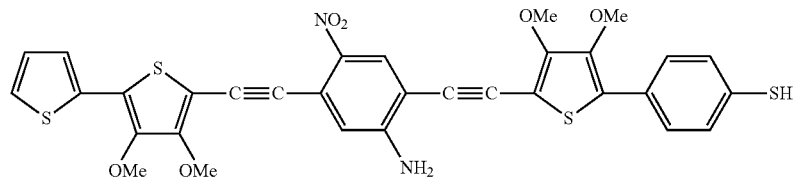
(S9)
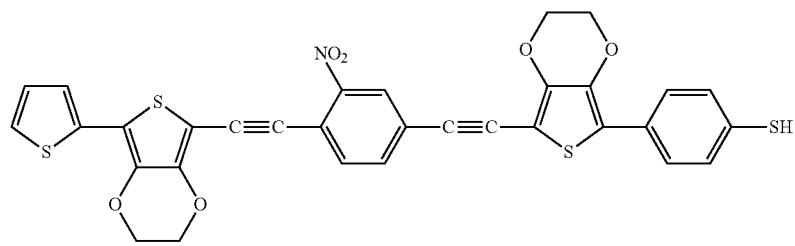
(S10)

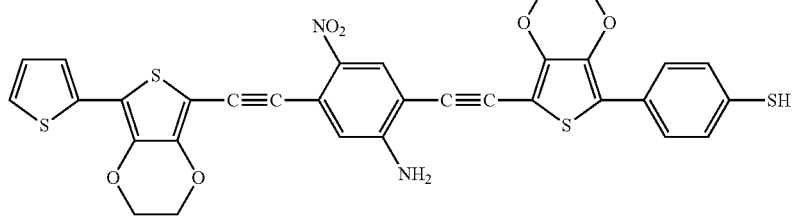

(S11)

The molecules S1 through S11 shown as examples are the same in that the core structure has a molecular structure expressed by the following general formula (2):

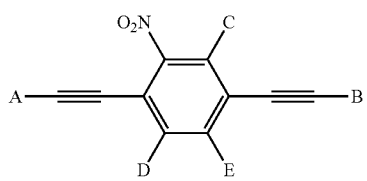

formula (2)

In the above general formula (2), C, D, and E represent substituent groups selected from the group (e) shown below or hydrogen atoms, and A and B represent molecular structures selected from the structures listed in the group (f) shown below.

(e) $NO_2$, CN, F, COOH, COOR, $SO_3H$, $SO_3R$, $NH_2$, $NR_2$, OH, OR, and R. Here, R is an alkyl group.

(f) A phenyl ring, a thiophene ring, a pyrrole ring, a furan ring, a pyridine ring, a pyrazine ring, a carbazole ring, a xanthene ring, a quinoline ring, an isoquinoline ring, and an acridine ring, respective substituent-modified structures of those rings, and coupled structures formed by coupling those rings with predetermined unit structures. Here, the predetermined unit structures are structures selected from C—C coupling units, ethylene double coupling units (C=C), and acetylene C—C triple coupling units.

The existence of the core structure is the factor for causing the LUMO to be localized asymmetrically along the molecular axis. However, the core structure for achieving those characteristics is not limited to the structure expressed by the general formula (2).

Additionally, among the molecules shown as examples, the molecules S2 through S11 are the same in that thiophene or a derivative thereof is included in the molecule. Particularly, the molecules S5, S6, and S9 through S11 are the same in that thiophene or a derivative thereof are included in more than one molecule.

Additionally, among the molecules shown as examples, the molecules S9 through S11 are the same in that the core structure has a molecular structure expressed by the following general formula (3) or (4):

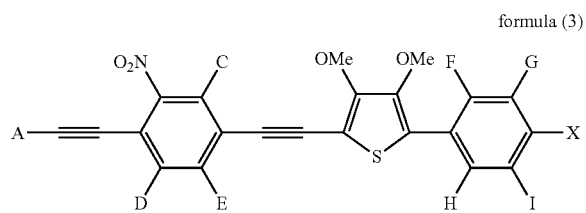

formula (3)

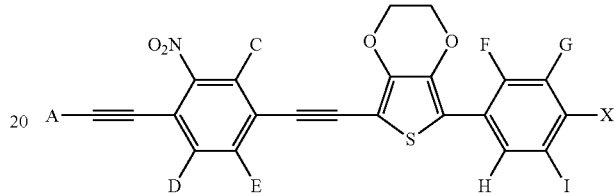

formula (4)

In the above general formulas (3) and (4), C, D, E, F, G, H, and I represent substituent groups selected from the group (e) shown below or hydrogen atoms, and A represents molecular structures selected from the structures listed in the group (f) shown below. Additionally, X represents a reactive functional group.

(e) $NO_2$, CN, F, COOH, COOR, $SO_3H$, $SO_3R$, $NH_2$, $NR_2$, OH, OR, and R. Here, R is an alkyl group.

(f) A phenyl ring, a thiophene ring, a pyrrole ring, a furan ring, a pyridine ring, a pyrazine ring, a carbazole ring, a xanthene ring, a quinoline ring, an isoquinoline ring, and an acridine ring, respective substituent-modified structures of those rings, and a coupled structure formed by coupling those rings with predetermined unit structures. Here, the predetermined unit structures are structures selected from C—C coupling units, ethylene double coupling units (C=C), and acetylene C—C triple coupling units.

FIGS. 7A through 17B are diagrams showing the highest occupied molecular orbitals (HOMOs) and the lowest unoccupied molecular orbitals (LUMOs) of the molecules S1 through S11. FIGS. 7A through 17B also show the principal distribution region ratios of the molecular orbitals, the HOMOs and the LUMOs, with respect to the molecular axis. As is apparent from the drawings, in the group of molecules expressed by (S1) through (S11), the principal distribution region ratio of the molecular orbital (LUMO) along the molecular axis is 90% or lower with respect to the molecular axis, and satisfies the condition (I).

While the HOMO of each of the molecules is delocalized along the molecular axis, the LUMO has the π-electron system broken along the molecular axis and is localized on the left side. That is, the molecular orbital is asymmetrically localized. This is an electron state in which a conductance change is caused by a change in the charge state, and asymmetrical I-V characteristics are achieved. It is apparent that each of the molecules S1 through S11 has such characteristics.

At the same time, those molecules satisfy the condition (II), and also belong to the group of molecules specified in the condition (III).

However, not all the molecules that satisfy the conditions (II) and (III) satisfy the condition (I). Examples of molecules that satisfy the conditions (II) and (III) include molecules T1 and T2 expressed by the following structural formulas (T1) and (T2):

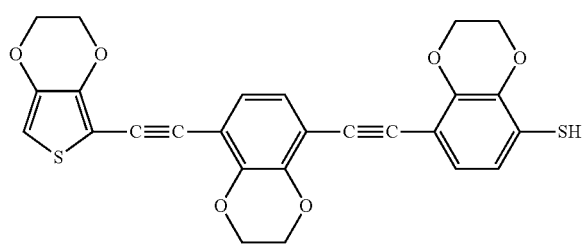

(T1)

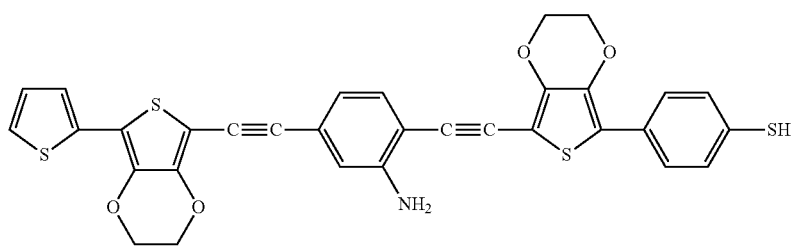

(T2)

The molecules T1 and T2 each have a core structure expressed by the general formula (1), and the HOMO level of each of those molecules is increased by an ether-type substituent group having electron donating properties. The calculated values of the HOMO levels of the molecules T1 and T2 through molecular orbital calculations are −5.12 eV and −4.92 eV, respectively, and the molecules T1 and T2 satisfy the condition (II).

However, as illustrated in FIGS. 18A through 19B, the LUMOs and the HOMOs of those molecules are delocalized along the molecular axis, and those molecules do not satisfy the condition (I), which needs to be satisfied in the organic molecular memory of this embodiment. Therefore, those molecules each have an electron state in which a resistance change does not easily occur. In the group of molecules according to this embodiment, which are shown as the molecules S1 through S11, the HOMO is delocalized along the molecular axis, and the LUMO is localized with respect to the molecular axis.

Table 2 shows the results of simulations performed to measure the memory retention times in two-terminal devices having the molecule A and the group of molecules S1 through S11 as the principal components. As shown in the table, each of the molecules has a longer memory retention time than that of the molecule A, which is a conventional molecule.

Before the increase from the HOMO level of the molecule A reaches approximately 0.4 eV (before the HOMO level reaches approximately −5.45 eV), the memory retention time slowly increases. After the increase in the HOMO level becomes larger than 0.45 eV (after the HOMO level reaches −5.40 eV), the memory retention time dramatically increases. As shown in the table, the molecule S11 has a memory retention time that is $8.07 \times 10^4$ times longer than the memory retention time of the molecule A.

TABLE 2

| Molecule | HOMO level (eV) | Memory retention time ratio |
| --- | --- | --- |
| Molecule A | −5.85 | 1.0 |
| S1 | −5.71 | 1.23 |
| S2 | −5.68 | 1.50 |
| S3 | −5.64 | 2.10 |
| S4 | −5.63 | 2.32 |

TABLE 2-continued

| Molecule | HOMO level (eV) | Memory retention time ratio |
| --- | --- | --- |
| S5 | −5.60 | 3.23 |
| S6 | −5.50 | 14.25 |
| S7 | −5.49 | 17.07 |
| S8 | −5.41 | 88.90 |
| S9 | −5.37 | 233.17 |
| S10 | −5.21 | 27889.03 |
| S11 | −5.18 | 80674.76 |

As described above, with an organic molecular memory using a novel molecule defined by this embodiment, an organic molecular memory that has a longer memory retention time than the conventional memory retention time can be provided. Additionally, by using molecules with different HOMO levels under the conditions specified to have a particular molecular structure and a particular electron state, the memory retention time of the organic molecular memory can be controlled, and a device that has a memory retention time suitable for the use of the memory can be provided.

Conventional organic molecular memories have possibilities for much higher densities and capacities, and lower power consumptions. However, those memories have short memory retention times. Even where those memories are put on the market, the range of application is very narrow. However, with the organic molecular memory of this embodiment, the range of application is dramatically widened, and practical electronic devices that fully utilize the above described advantages of the organic molecular memory can be provided.

Second Embodiment

An organic molecular memory of this embodiment is an organic molecular memory in which one transistor and one organic molecular layer constitute a memory cell. Other than the memory cell structure, this embodiment is basically the same as the first embodiment. Therefore, explanation of the aspects that are the same as those of the first embodiment will not be repeated herein.

Figure 20:
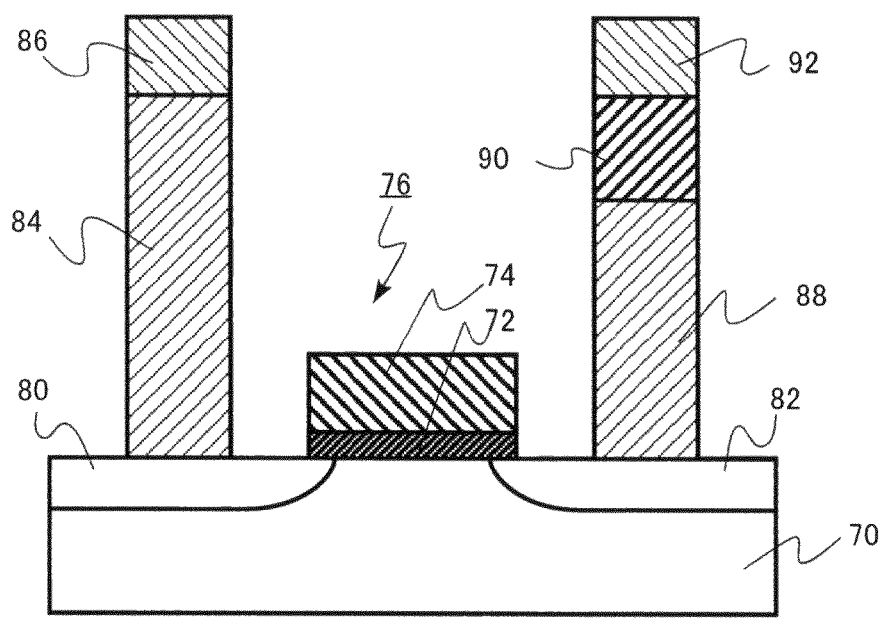
FIG. 20 is a schematic cross-sectional view of an organic molecular memory according to a second embodiment.

FIG. 20 is a schematic cross-sectional view of a memory cell portion of the organic molecular memory of this embodiment.

The organic molecular memory of this embodiment is a molecular memory in which one transistor and one organic molecular layer of a variable resistance type constitute a memory cell. As shown in FIG. 20, a select transistor 76 that includes a gate insulating film 72 and a gate electrode 74 is formed on a substrate 70. In the substrate 70, a first source/drain region 80 and a second source/drain region 82 are formed, with the gate electrode 74 being interposed in between.

The substrate 70 is a silicon substrate, for example. The gate insulating film 72 is a silicon oxide film, for example. The gate electrode 74 is polycrystalline silicon, for example. The first source/drain region 80 and the second source/drain region 82 are diffused layers having arsenic (As) as an impurity, for example.

A first contact plug 84 is formed on the first source/drain region 80. A first bit line 86 is formed on the first contact plug 84. The material of the first contact plug 84 is tungsten, for example, and the material of the first bit line 86 is molybdenum, for example.

A second contact plug (the first conductive layer) 88 is formed on the second source/drain region 82. A second bit line (the second conductive layer) 92 is formed on the second contact plug 88, with an organic molecular layer 90 being interposed in between. The material of the second contact plug 88 is tungsten, for example, and the material of the second bit line 92 is molybdenum, for example. The material of the second bit line 92 is different from the material of the second contact plug 88.

Variable-resistance molecular chains 16a form the organic molecular layer 90. The variable-resistance molecular chains forming the organic molecular layer 90 are the same as the variable-resistance molecular chain illustrated in FIG. 2, for example.

Each variable-resistance molecular chain is a molecular chain having a function to change its resistance, depending on whether an electric field exists or whether charges are injected thereinto. For example, each variable-resistance molecular chain having the molecular structure illustrated in FIG. 2 can switch between a low-resistance state and a high-resistance state through voltage application between both ends.

In the organic molecular memory of this embodiment, writing and erasing can be performed on the organic molecular layer 90 by applying voltage between the first bit line 86 and the second bit line 92 while the select transistor 76 is on. Additionally, while the select transistor 76 is on, the current flowing between the first bit line 86 and the second bit line 92 is monitored, to read the resistance state of the organic molecular layer 90. Through those operations, the memory cell functions.

In this embodiment, an organic molecular memory that has an improved memory retention time can be realized, as in the first embodiment.

As for the binding to the electrodes in the organic molecular memory of this embodiment, one of the electrodes has chemical binding, and the other one is in a physical adsorption state or has an air gap. The organic molecular memory can be used as a device structure having an asymmetrical binding structure. Accordingly, asymmetrical I-V characteristics can be realized. By using a molecule having an asymmetrical electron state in the molecule as in this embodiment, asymmetrical I-V characteristics can also be realized even in a device structure in which both electrodes are bound through chemical binding.

The organic molecule of this embodiment is often used as a structure that has one or both of the molecular ends bound to the electrode(s) through chemical binding, as described above. Therefore, a reactive functional group called a linker is attached to one or each of the ends of the molecule. In this embodiment, a SH group is used as the linker. However, the reactive functional group to be used as the linker is not limited to a SH group, and any of the following functional groups can be used.

—SCOCH3, —SeH, —TeH, —SCN, —NC, —SiCl$_3$, —Si(OR)$_3$, RSiCl$_3$, —RSi(OR)$_3$, —CH=CH$_2$, —NH$_2$, —COOH, —COOR, —SO$_2$OR, —NC, —CN, —P=O(OH)$_2$, and —P=O(OR)$_2$. Here, R is an alkyl group.

Any of those reactive functional groups may be bound directly to the molecular frame over which the π-electron system of the organic molecule of this embodiment spreads. Alternatively, an alkyl group may be interposed between the reactive functional group and the molecular frame over which the π-electron system spreads.

In a case where an organic molecule containing an alkyl group interposed between the reactive functional group and the molecular frame, on which the π-electron system spreads, is chemically bound to an electrode, the alkyl group exists between the chemically-bound site and the molecular frame, on which the π-electron system spreads.

Organic molecular memories are not limited to those of the cross-point type and the one transistor and organic molecular layer type described in the embodiments, and it is possible to use organic molecular memories having other structures, such as three-dimensional structures.

Third Embodiment

An organic molecular memory of this embodiment is an organic molecular memory which has an organic molecule including a donor type molecule unit. Other than the, this embodiment is basically the same as the first and second embodiment. Therefore, explanation of the aspects that are the same as those of the first and second embodiment will not be repeated herein.

Here, a molecule unit having electron donating character is called "a donor type molecule unit". The donor type molecular unit will effectively increase HOMO level of the organic molecule of this embodiment and may change localized orbital from LUMO to HOMO. To make the donor type molecular achieve such an effect, the donor type molecular need to have stronger electron donating character compared to phenyl rings which are fundamental structure units of the organic molecule of this embodiment. At least, HOMO level at hydrogen terminated portion of the donor type molecule unit is required to exceed HOMO level at hydrogen terminated portion of the fundamental structure units. Therefore, "donor type molecule unit" can be defined as molecule units having higher HOMO level at hydrogen terminated portion thereof compared to HOMO level of benzene ($C_6H_6$) which is hydrogen terminated portion of the fundamental structure units. HOMO levels can be calculated by the molecular orbital calculation according to the predetermined method described above. HOMO level of the benzene ($C_6H_6$) is calculated to be −6.99 eV.

The organic molecular memory of this embodiment has an organic molecular layer including the group of molecules specified below.

The group of molecules having a core structure expressed by the following general formula (5), formula (5)

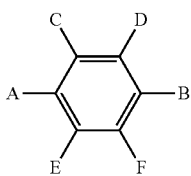

In the general formula (5), C, D, E, and F represent substituent groups selected from a group (a) shown below, hydrogen atoms, a donor type molecular unit expressed by the following formulas (D1) through (D10), or a derivative of the molecular unit expressed by the following formulas (D1) through (D10). And A and B represent molecular structures selected from structures listed in a group (b) shown below or a donor type molecular unit expressed by the following formulas (D1) through (D10), or a derivative of the molecular unit expressed by the following formulas (D1) through (D10). At least one of A, B, C, D, E and F represents a donor type molecular unit expressed by the following formulas (D1) through (D10), or a derivative of the molecular unit expressed by the following formulas (D1) through (D10).

(a) $NO_2$, CN, F, COOH, COOR, $SO_3H$, $SO_3R$, $NH_2$, $NR_2$, OH, OR, and R, where R is an alkyl group.

(b) a phenyl ring, a thiophene ring, a pyrrole ring, a furan ring, a pyridine ring, a pyrazine ring, a carbazole ring, a xanthene ring, a quinoline ring, an isoquinoline ring, and an acridine ring, respective substituent-modified structures of the rings, and coupled structures formed by coupling the rings via a predetermined unit structure. The predetermined unit structure is a structure selected from a C—C coupling unit, an ethylene double coupling unit (C═C), and an acetylene C—C triple coupling unit.

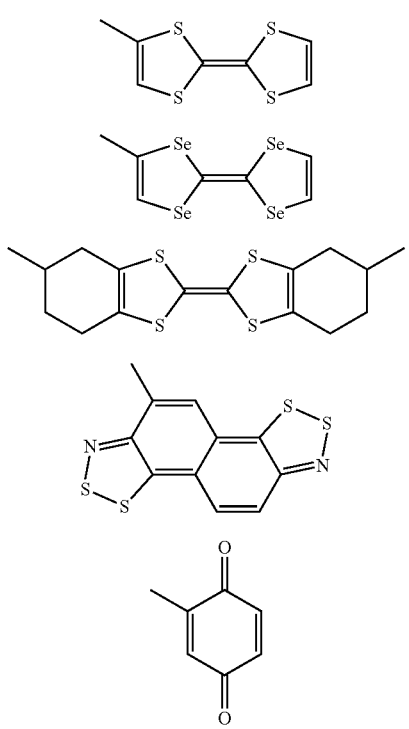

(D6)

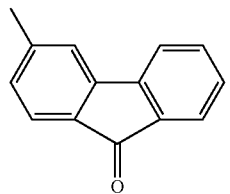

(D7)

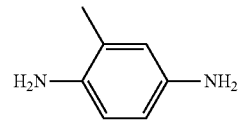

(D8)

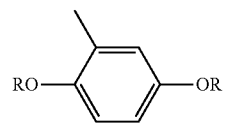

(D9)

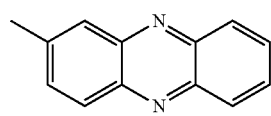

(D10)

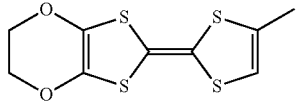

R in (D8) represents an alkyl group.

The preferable aspect of this embodiment is an organic molecular memory comprising: a first conductive layer; a second conductive layer; and an organic molecular layer provided between the first conductive layer and the second conductive layer. The organic molecular layer includes an organic molecule having a core structure expressed by the following general formula (5), formula (5)

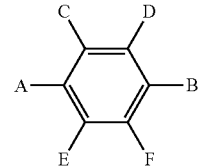

where C, D, E, and F represent substituent groups selected from a group (a) shown below, hydrogen atoms, a donor type molecular unit expressed by a following formula (D1) or a derivative thereof, and A and B represent molecular structures selected from structures listed in a group (b) shown below or a donor type molecular unit expressed by the following formula (D1) or a derivative thereof; at least one of A, B, C, D, E and F represents a donor type molecular unit expressed by the following formula (D1) or a derivative thereof:

(a) $NO_2$, CN, F, COOH, COOR, $SO_3H$, $SO_3R$, $NH_2$, $NR_2$, OH, OR, and R, where R is an alkyl group; and (b) a phenyl ring, a thiophene ring, a pyrrole ring, a furan ring, a pyridine ring, a pyrazine ring, a carbazole ring, a xanthene ring, a quinoline ring, an isoquinoline ring, and an acridine ring, respective substituent-modified structures of the rings, coupled structures formed by coupling the rings or respective substituent-modified structures of the rings via a predetermined unit structure, where the predetermined unit structure is a structure selected from a C—C coupling unit, an ethylene double coupling unit (C═C), and an acetylene C—C triple coupling unit;

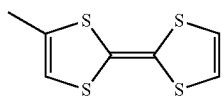
(D1)

Examples of an organic molecule of this embodiment, i.e. organic molecules expressed by molecular structure formulas (S12), (S13) and (S14), are shown below.

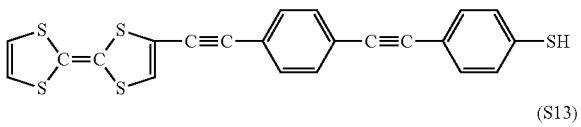
(S12)

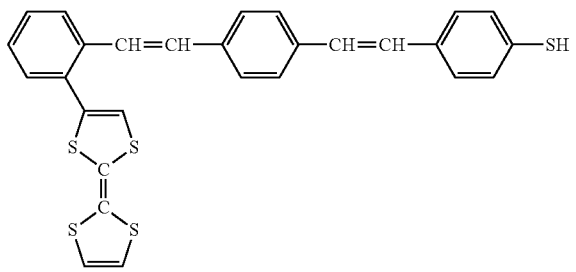
(S13)

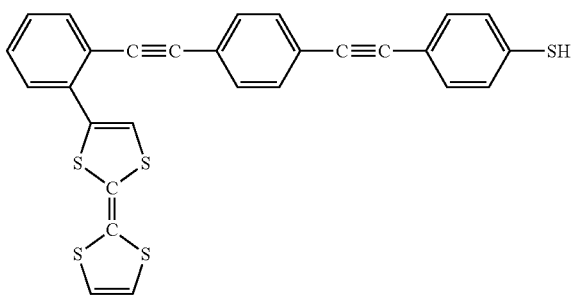
(S14)

FIGS. 21A through 23B are diagrams showing the highest occupied molecular orbitals (HOMOs) and the lowest unoccupied molecular orbitals (LUMOs) of the molecules S12 through S14.

Table 3 shows the results of simulations performed to measure the memory retention times in two-terminal devices having the group of molecules S12 through S14 as the principal components. Results of molecule A and the group of molecules S1 through S11 are also shown for reference. As shown in the table, each of the molecules has a longer memory retention time than that of the molecule A which is a conventional molecule and the group of molecules S1 through S11.

TABLE 3

| Molecule | HOMO level (eV) | Memory retention time ratio |
| --- | --- | --- |
| Molecule A | −5.85 | 1.0 |
| S1 | −5.71 | 1.23 |
| S2 | −5.68 | 1.50 |

TABLE 3-continued

| Molecule | HOMO level (eV) | Memory retention time ratio |
| --- | --- | --- |
| S3 | −5.64 | 2.10 |
| S4 | −5.63 | 2.32 |
| S5 | −5.60 | 3.23 |
| S6 | −5.50 | 14.25 |
| S7 | −5.49 | 17.07 |
| S8 | −5.41 | 88.90 |
| S9 | −5.37 | 233.17 |
| S10 | −5.21 | 27889.03 |
| S11 | −5.18 | 80674.76 |
| S12 | −4.89 | $3.415802 \times 10^{10}$ |
| S13 | −4.81 | $2.875675 \times 10^{12}$ |
| S14 | −4.79 | $9.216989 \times 10^{12}$ |

As described above, the transfer rate of electrons from the Fermi level of the electrode back to the HOMO level in the positively charged state exponentially increases with an increase in the difference between the Fermi level and the HOMO level increases. In other words, the transfer rate of electrons from the Fermi level of the electrode back to the HOMO level in the positively charged state exponentially decreases as the difference between the Fermi level and the HOMO level decreases, therefore, memory retention time increases exponentially. By the introduction of donor type molecular unit of this embodiment, HOMO level increase and the difference between the Fermi level and the HOMO level becomes very small. This results in the large reduction in transfer rate of electrons. This may cause the extensive increase of the memory retention time.

While certain embodiments have been described, these embodiments have been presented by way of example only, and are not intended to limit the scope of the inventions. Indeed, the organic molecular memories and the organic molecules for the organic molecular memories described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An organic molecular memory comprising:

a first conductive layer;

a second conductive layer; and an organic molecular layer provided between the first conductive layer and the second conductive layer, the organic molecular layer includes an organic molecule selected from a group of molecules that satisfy the following conditions (I) and (II), the organic molecule has a molecular frame with a π-electron system spreading along the molecular axis:

(I) one of a highest occupied molecular orbital (HOMO) and a lowest unoccupied molecular orbital (LUMO) is delocalized along a molecular axis, and the other one is localized with respect to the molecular axis; and (II) a value of an energy level of the highest occupied molecular orbital (HOMO) is −5.75 eV or higher.

2. The memory according to claim 1, wherein the group of molecules is specified in one of (i) and (ii):

(i) a group of molecules having a core structure expressed by the following general formula (1), formula (1)

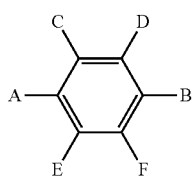

where C, D, E, and F represent substituent groups selected from a group (a) shown below or hydrogen atoms, and A and B represent molecular structures selected from structures listed in a group (b) shown below:
(a) $NO_2$, CN, F, COOH, COOR, $SO_3H$, $SO_3R$, $NH_2$, $NR_2$, OH, OR, and R, where R is an alkyl group; and
(b) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and
coupled structures formed by coupling the rings or respective substituent-modified structures of the rings via a predetermined unit structure, where the predetermined unit structure is a structure selected from a C—C coupling unit, an ethylene double coupling unit (C=C), and an acetylene C—C triple coupling unit;
(ii) a group of molecules of either fundamental structures or coupled structures thereof,
the fundamental structures are polycyclic aromatic hydrocarbons expressed by the following formulas (C1) through (C16) or respective substituent-modified structures of the polycyclic aromatic hydrocarbons being substituent-modified part of carbon (C) with nitrogen (N), or being substituent-modified by a substituent group selected from the group (a),
the coupled structures are formed by coupling the polycyclic aromatic hydrocarbons or the respective substituent-modified structures of the polycyclic aromatic hydrocarbons via a predetermined unit structure, where the predetermined unit structure is a structure selected from a C—C coupling unit, an ethylene double coupling unit (C=C), and an acetylene C—C triple coupling unit.

(C1)

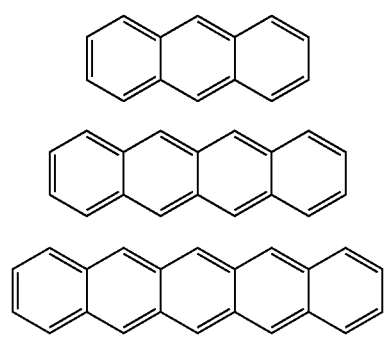

(C2)

(C3)

(C4)

(C5)

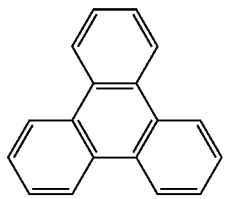

(C6)

(C7)

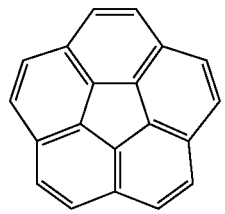

(C8)

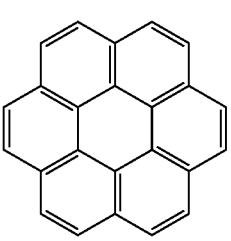

(C9)

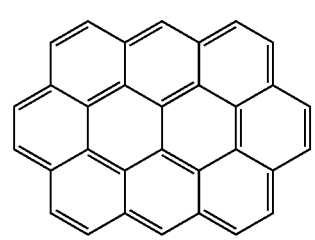

(C10)

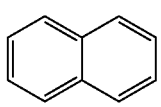

(C11)

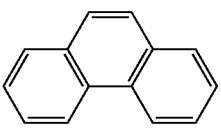

(C12)

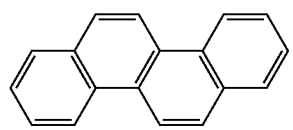

(C13)

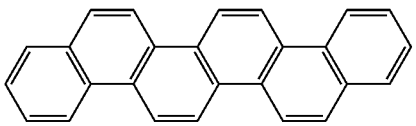

-continued

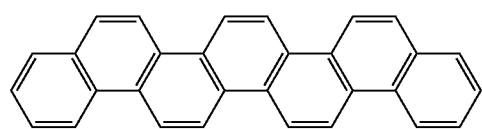
(C14)

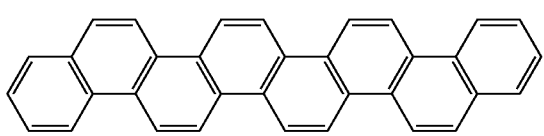
(C15)

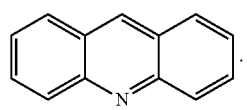
(C16)

3. The memory according to claim 2, wherein the organic molecule has at least one or more NO$_2$ substituent group.

4. The memory according to claim 2, wherein, in the general formula (1), A and B are fundamental structures or coupled structures thereof, the fundamental structures are structures being expressed by the following formulas (B1) through (B16) in which C, D, E, and F represent substituent groups selected from the group (a), R being an alkyl group, or respective substituent-modified structures formed by substituent-modifying the structures expressed by formulas (B1) through (B16), the coupled structures are formed by coupling the fundamental structures or the substituent-modified structures via a predetermined unit structure, where the predetermined unit structure is a structure selected from a C—C coupling unit, an ethylene double coupling unit (C=C), and an acetylene C—C triple coupling unit (B1)

(B2)

(B3)

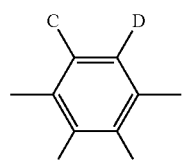

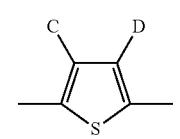

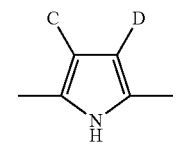

(B4)

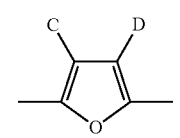

-continued

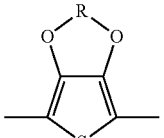
(B5)

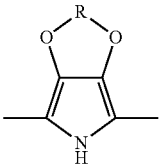
(B6)

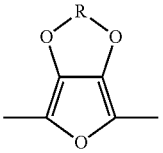
(B7)

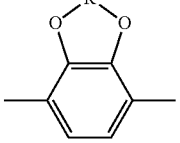
(B8)

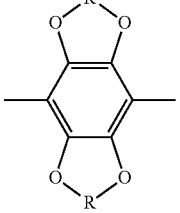
(B9)

(B10)

(B11)

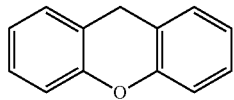
(B12)

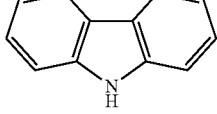
(B13)

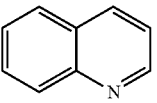
(B14)

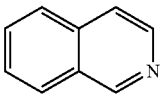
(B15)

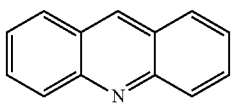

(B16)

5. The memory according to claim 1, wherein the group of molecules is specified below:

a group of molecules having a core structure expressed by the following general formula (5),

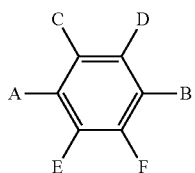

formula (5)

where C, D, E, and F represent substituent groups selected from a group (a) shown below, hydrogen atoms, a donor type molecular unit expressed by a following formulas (D1) through (D10), or a derivative thereof, and A and B represent molecular structures selected from structures listed in a group (b) shown below or a donor type molecular unit expressed by the following formulas (D1) through (D10), or a derivative thereof; at least one of A, B, C, D, E and F represents a donor type molecular unit expressed by the following formulas (D1) through (D10), or a derivative thereof:

(a) $NO_2$, CN, F, COOH, COOR, $SO_3H$, $SO_3R$, $NH_2$, $NR_2$, OH, OR, and R, where R is an alkyl group; and (b) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and coupled structures formed by coupling the rings or respective substituent-modified structures of the rings via a predetermined unit structure, where the predetermined unit structure is a structure selected from a C—C coupling unit, an ethylene double coupling unit (C=C), and an acetylene C—C triple coupling unit;

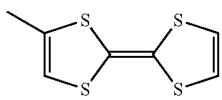

(D1)

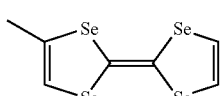

(D2)

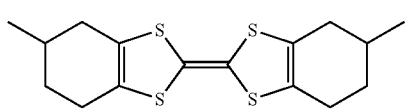

(D3)

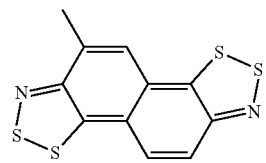

(D4)

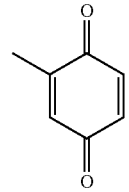

(D5)

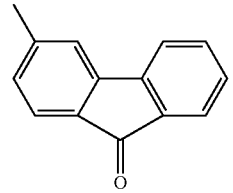

(D6)

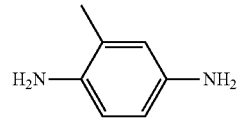

(D7)

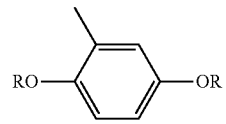

(D8)

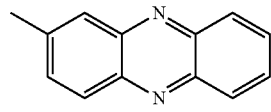

(D9)

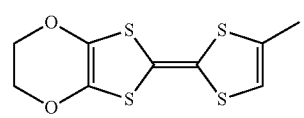

(D10)

6. The memory according to claim 1, wherein
one end of the organic molecule is chemically bound to one of the first conductive layer and the second conductive layer, and
the other end of the organic molecule is physically adsorbed to the other one of the conductive layers, or an air gap of 0.3 nm or smaller exists between the other end and the other one of the conductive layers.

7. The memory according to claim 1, wherein ends of the organic molecule are chemically bound to the first conductive layer and the second conductive layer.

8. The memory according to claim 1, wherein one of the highest occupied molecular orbital (HOMO) and the lowest unoccupied molecular orbital (LUMO) is localized asymmetrically about the molecular axis.

9. An organic molecular memory comprising:
a first conductive layer;
a second conductive layer; and
an organic molecular layer provided between the first conductive layer and the second conductive layer, the organic molecular layer includes an organic molecule selected from a group of molecules expressed by the following general formula (2) and a group of molecules having the value of an energy level of a highest occupied molecular orbital (HOMO) −5.75 eV or higher, formula (2)

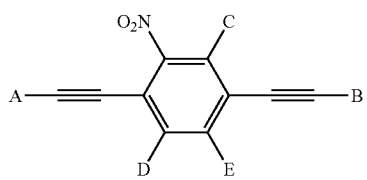

where C, D, and E represent substituent groups selected from the group (e) shown below or hydrogen atoms, and A and B represent molecular structures selected from the structures listed in the group (f) shown below:

(e) $NO_2$, CN, F, COOH, COOR, $SO_3H$, $SO_3R$, $NH_2$, $NR_2$, OH, OR, and R, where R is an alkyl group; and (f) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and coupled structures formed by coupling the rings or respective substituent-modified structures of the rings via a predetermined unit structure, where the predetermined unit structure is a structure selected from a C—C coupling unit, an ethylene double coupling unit (C=C), and an acetylene C—C triple coupling unit.

10. The memory according to claim 9, wherein the organic molecule contains thiophene or a derivative thereof.

11. The memory according to claim 9, wherein the organic molecule has a core structure expressed by one of the following general formulas (3) and (4):

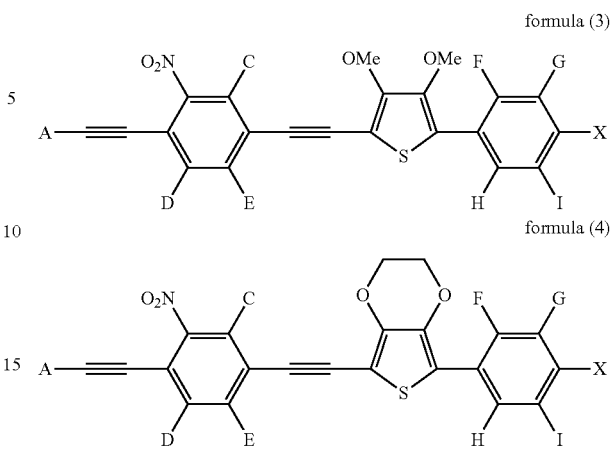

where C, D, E, F, G, H, and I represent substituent groups selected from a group (e) shown below or hydrogen atoms, and A represents molecular structures selected from the structures listed in a group (f) shown below, X representing a reactive functional group:

(e) $NO_2$, CN, F, COOH, COOR, $SO_3H$, $SO_3R$, $NH_2$, $NR_2$, OH, OR, and R, where R is an alkyl group; and (f) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and coupled structures formed by coupling the rings or respective substituent-modified structures of the rings via a predetermined unit structure, where the predetermined unit structure is a structure selected from a C—C coupling unit, an ethylene double coupling unit (C=C), and an acetylene C—C triple coupling unit.

12. The memory according to claim 9, wherein the organic molecule includes a structure expressed by one of the following formulas (S1) through (S11):

(S1)

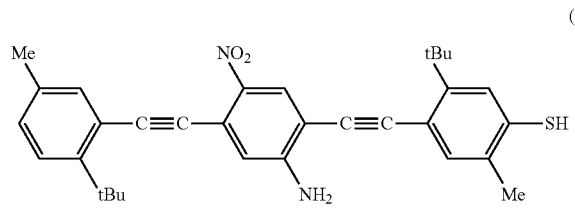

(S2)

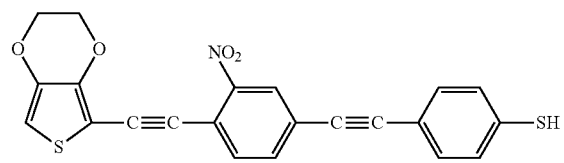

(S3)

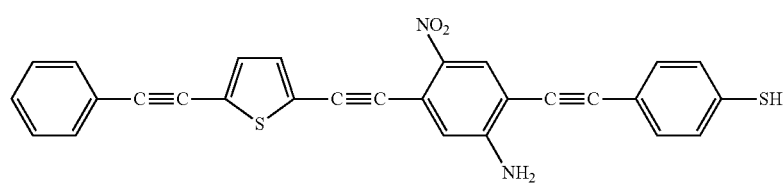

(S4)

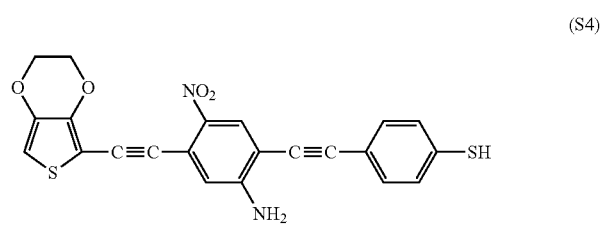

(S5)

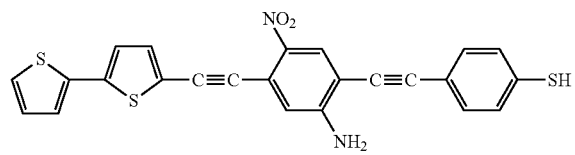

-continued

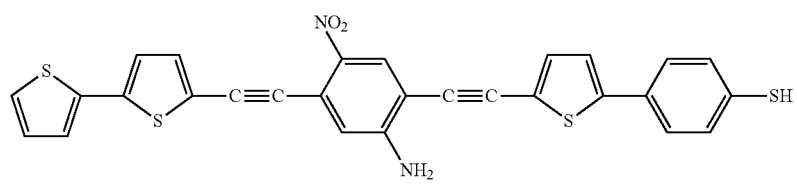
(S6)

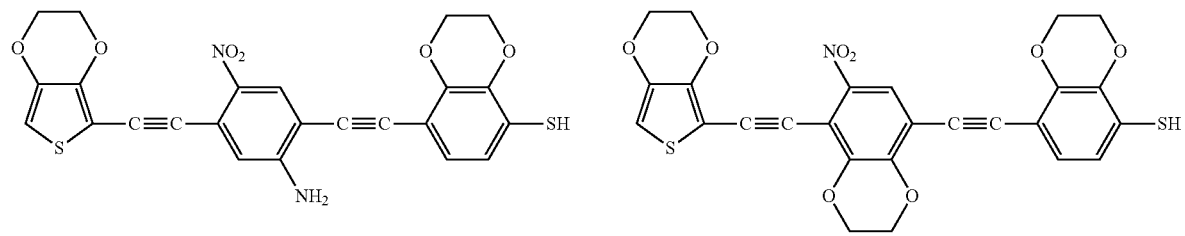
(S7) (S8)

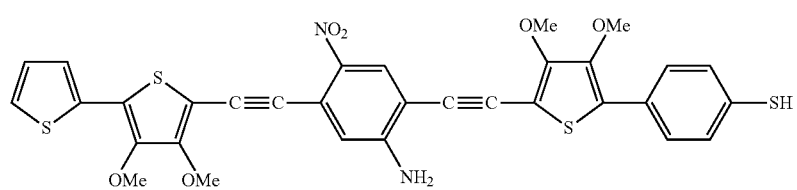
(S9)

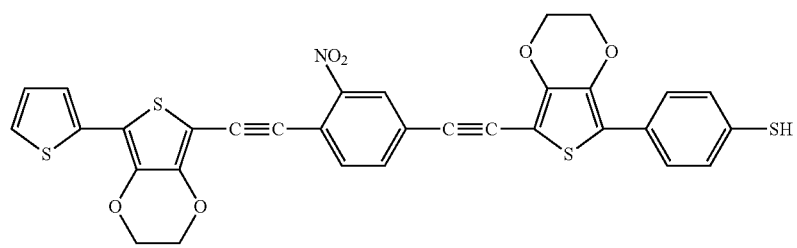
(S10)

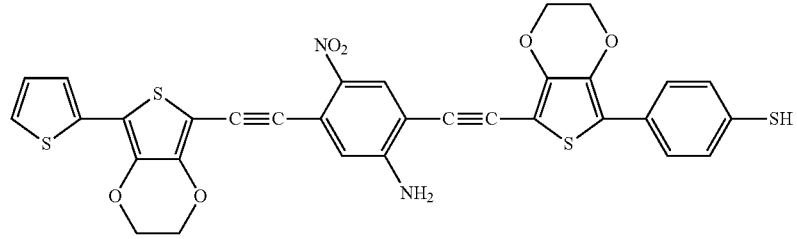
(S11)

13. An organic molecular memory comprising:
a first conductive layer;
a second conductive layer; and
an organic molecular layer provided between the first conductive layer and the second conductive layer, the organic molecular layer includes an organic molecule having a core structure expressed by the following general formula (5),

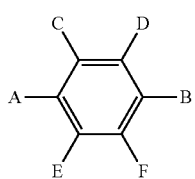

formula (5)

where C, D, E, and F represent substituent groups selected from a group (a) shown below, hydrogen atoms, a molecular unit expressed by a following formula (D1) or a derivative thereof, and A and B represent molecular structures selected from structures listed in a group (b) shown below or the molecular unit expressed by the following formula (D1) or the derivative thereof; at least one of A, B, C, D, E and F includes a molecular unit expressed by the following formula (D1) or the derivative thereof:

(a) $NO_2$, CN, F, COOH, COOR, $SO_3H$, $SO_3R$, $NH_2$, $NR_2$, OH, OR, and R, where R is an alkyl group; and (b) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and coupled structures formed by coupling the rings or respective substituent-modified structures of the rings via a predetermined unit structure, where the predetermined unit structure is a structure selected from a C—C coupling unit, an ethylene double coupling unit (C=C), and an acetylene C—C triple coupling unit;

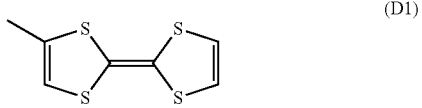
(D1)

14. The memory according to claim 13, wherein the organic molecular layer includes an organic molecule including a structure expressed by one of the following formulas (S12) through (S14):

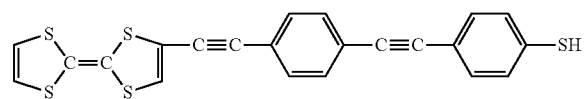
(S12)

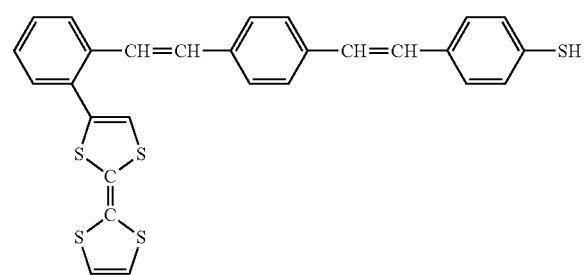
(S13)

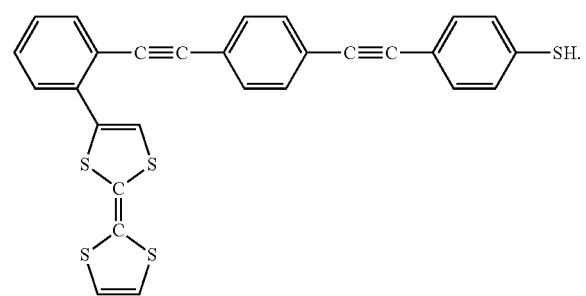
(S14)

15. An organic molecule for an organic molecular memory, the organic molecule being selected from a group of molecules that satisfy the following conditions (I) and (II):

(I) one of a highest occupied molecular orbital (HOMO) and a lowest unoccupied molecular orbital (LUMO) is delocalized along a molecular axis, and the other one is localized with respect to the molecular axis;

(II) a value of an energy level of the highest occupied molecular orbital (HOMO) is −5.75 eV or higher.

16. The molecule according to claim 15, wherein the group of molecules is specified in one of (i) and (ii):

(i) a group of molecules having a core structure expressed by the following general formula (1), and contains a reactive functional group,

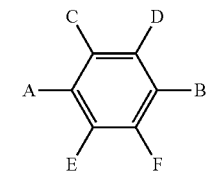
formula (1)

where C, D, E, and F represent substituent groups selected from a group (a) shown below or hydrogen atoms, and A and B represent molecular structures selected from structures listed in a group (b) shown below:

(a) $NO_2$, CN, F, COOH, COOR, $SO_3H$, $SO_3R$, $NH_2$, $NR_2$, OH, OR, and R, where R is an alkyl group; and (b) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and coupled structures formed by coupling the rings or respective substituent-modified structures of the rings via a predetermined unit structure, where the predetermined unit structure is a structure selected from a C—C coupling unit, an ethylene double coupling unit (C=C), and an acetylene C—C triple coupling unit;

(ii) a group of molecules of either fundamental structures or coupled structures thereof, the fundamental structures are polycyclic aromatic hydrocarbons expressed by the following formulas (C1) through (C16) or respective substituent-modified structures of the polycyclic aromatic hydrocarbons being substituent-modified part of carbon (C) with nitrogen (N), or being substituent-modified by a substituent group selected from the group (a), the coupled structures are formed by coupling the polycyclic aromatic hydrocarbons or the respective substituent-modified structures of the polycyclic aromatic hydrocarbons via a predetermined unit structure, where the predetermined unit structure is a structure selected from a C—C coupling unit, an ethylene double coupling unit (C=C), and an acetylene C—C triple coupling unit

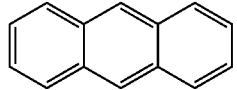
(C1)

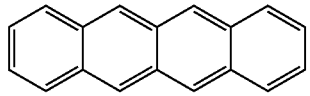
(C2)

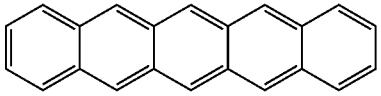
(C3)

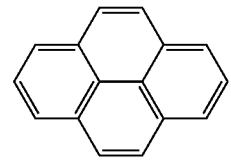
(C4)

(C5) 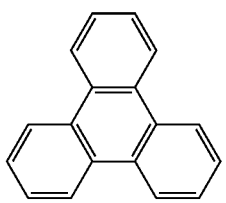

(C6) 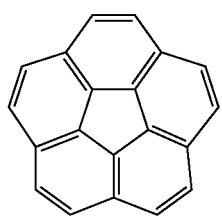

(C7) 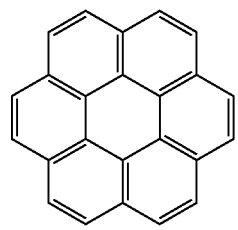

(C8) 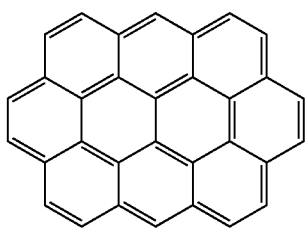

(C9) 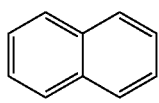

(C10) 

(C11) 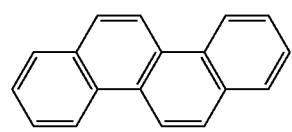

(C12) 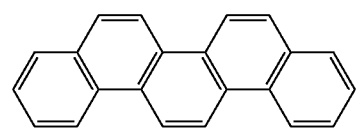

(C13) 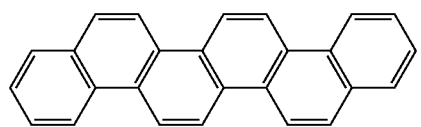

(C14) 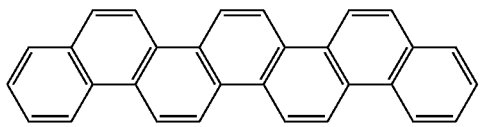

(C15) 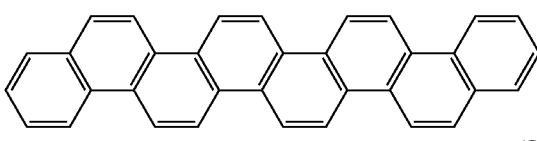

(C16) 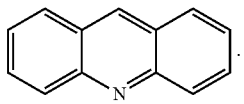

17. The molecule according to claim 16, wherein the reactive functional group is one of functional groups shown in the following group (d):

(d) —SCOCH3, —SeH, —TeH, —SCN, —NC, —SiCl$_3$, —Si(OR)$_3$, RSiCl$_3$, —RSi (OR)$_3$, —CH=CH$_2$, —NH$_2$, —COOH, —COOR, —SO$_2$OR, —NC, —CN, —P=O(OH)$_2$, and —P=O(OR)$_2$, where R is an alkyl group.

18. The molecule according to claim 16, wherein
in the group of molecules specified in (i), an alkyl group is provided between the core structure and the reactive functional group, and
in the group of molecules specified in (ii), an alkyl group is provided between the molecular system and the reactive functional group.

19. The molecule according to claim 16, wherein the molecule has at least one or more NO$_2$ substituent group.

20. The molecule according to claim 16, wherein, in the general formula (1), A and B are fundamental structures or coupled structures thereof,
the fundamental structures are structures being expressed by the following formulas (B1) through (B16) in which C, D, E, and F represent substituent groups selected from the group (a), R being an alkyl group, or respective substituent-modified structures formed by substituent-modifying the structures expressed by formulas (B1) through (B16),
the coupled structures are formed by coupling the fundamental structures or the substituent-modified structures via a predetermined unit structure, where the predetermined unit structure is a structure selected from a C—C coupling unit, an ethylene double coupling unit (C=C), and an acetylene C—C triple coupling unit (B1) 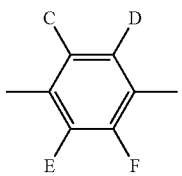

(B2) 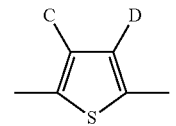

-continued (B3) 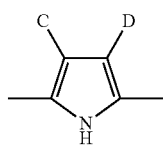

(B4) 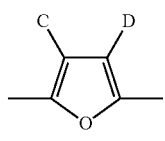

(B5) 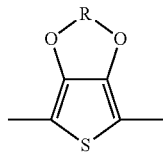

(B6) 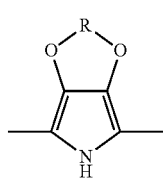

(B7) 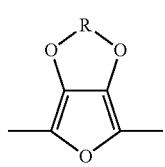

(B8) 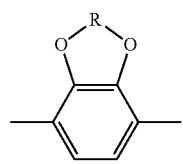

(B9) 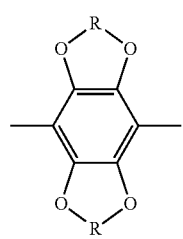

(B10) 

(B11) 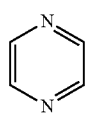

(B12) 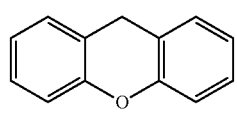

-continued (B13) 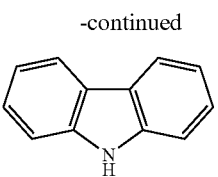

(B14) 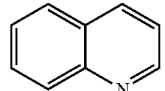

(B15) 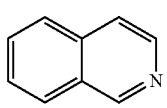

(B16) 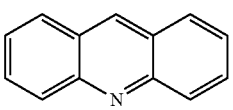

21. The molecule according to claim 15, wherein the group of molecules is specified below:
  a group of molecules having a core structure expressed by the following general formula (5), formula (5)

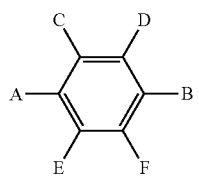

where C, D, E, and F represent substituent groups selected from a group (a) shown below, hydrogen atoms, a molecular unit expressed by the following formulas (D1) through (D10), or a derivative thereof, and A and B represent molecular structures selected from structures listed in a group (b) shown below or a molecular unit expressed by the following formulas (D1) through (D10), or a derivative thereof; at least one of A, B, C, D, E and F includes molecular unit expressed by the following formulas (D1) through (D10), or a derivative thereof:

(a) $NO_2$, CN, F, COOH, COOR, $SO_3H$, $SO_3R$, $NH_2$, $NR_2$, OH, OR, and R, where R is an alkyl group; and (b) a phenyl ring, a thiophene ring, a pyrrole ring, a furan ring, a pyridine ring, a pyrazine ring, a carbazole ring, a xanthene ring, a quinoline ring, an isoquinoline ring, an acridine ring, respective substituent-modified structures of the rings, and coupled structures formed by coupling the rings via a predetermined unit structure, where the predetermined unit structure is a structure selected from a C—C coupling unit, an ethylene double coupling unit (C=C), and an acetylene C—C triple coupling unit:

(D1) 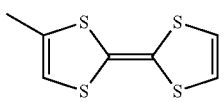

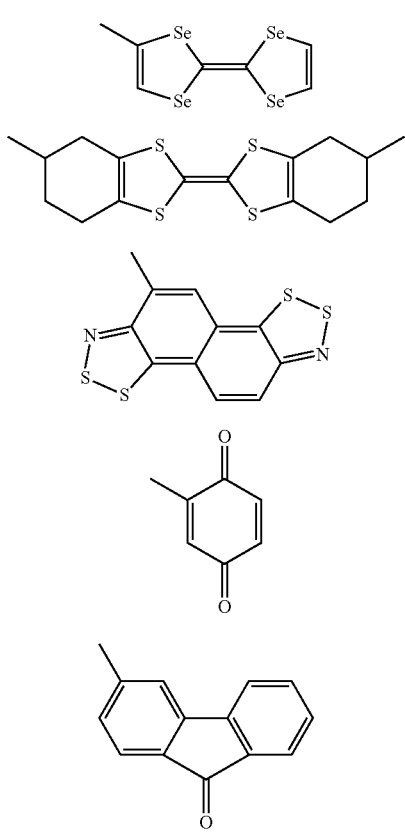
(D2)
(D3)
(D4)
(D5)
(D6)
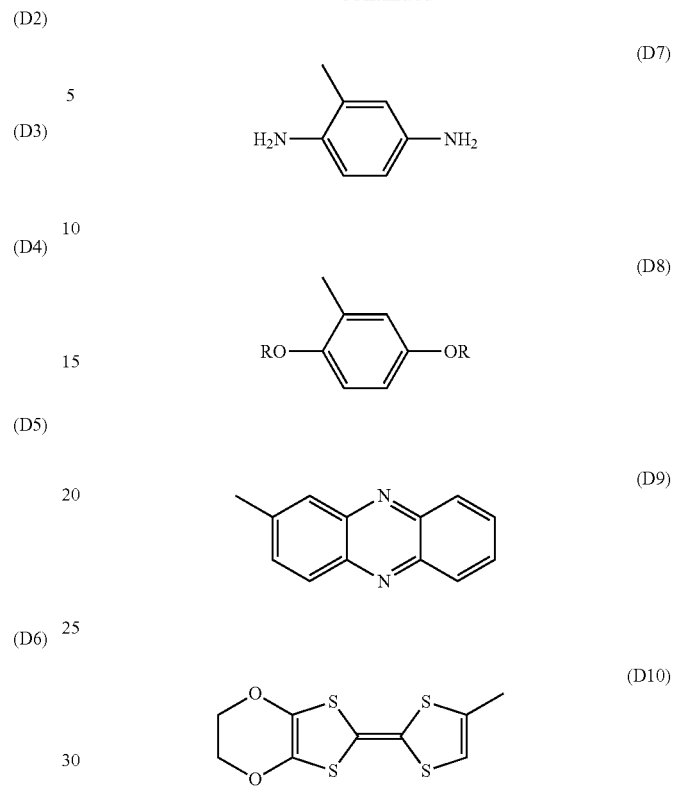
(D7)
(D8)
(D9)
(D10)
* * * * *